United States Patent
Takaura et al.

(10) Patent No.: US 7,834,337 B2
(45) Date of Patent: Nov. 16, 2010

(54) MEMORY DEVICE

(75) Inventors: Norikatsu Takaura, Tokyo (JP); Motoyasu Terao, Hinode (JP); Hideyuki Matsuoka, Nishitokyo (JP); Kenzo Kurotsuchi, Kokubunji (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 762 days.

(21) Appl. No.: 10/587,079

(22) PCT Filed: Dec. 20, 2004

(86) PCT No.: PCT/JP2004/019001

§ 371 (c)(1), (2), (4) Date: Jul. 21, 2006

(87) PCT Pub. No.: WO2005/076355

PCT Pub. Date: Aug. 18, 2005

(65) Prior Publication Data

US 2009/0108247 A1 Apr. 30, 2009

(30) Foreign Application Priority Data

Feb. 6, 2004 (JP) .............................. 2004-030286

(51) Int. Cl.
*H01L 29/02* (2006.01)

(52) U.S. Cl. .................. 257/2; 257/42; 257/E27.004; 257/E45.002; 365/148; 365/46

(58) Field of Classification Search .............. 257/2, 257/42, 529
See application file for complete search history.

(56) References Cited

U.S. PATENT DOCUMENTS

| | | | | |
|---|---|---|---|---|
| 4,475,178 A | * | 10/1984 | Kinoshita | 365/203 |
| 4,529,991 A | * | 7/1985 | Wada et al. | 355/31 |
| 5,225,273 A | * | 7/1993 | Mikoshiba et al. | 428/323 |
| 5,278,011 A | * | 1/1994 | Yamada et al. | 430/19 |
| 5,644,416 A | * | 7/1997 | Morikawa et al. | 349/86 |
| 6,418,049 B1 | * | 7/2002 | Kozicki et al. | 365/174 |
| 6,625,848 B1 | * | 9/2003 | Schneider | 16/436 |
| 7,335,907 B2 | * | 2/2008 | Terao et al. | 257/2 |
| 2004/0178402 A1 | * | 9/2004 | Ovshinsky et al. | 257/2 |

* cited by examiner

*Primary Examiner*—Thanh V Pham
*Assistant Examiner*—Mark A Laurenzi, III
(74) *Attorney, Agent, or Firm*—Miles & Stockbridge P.C.

(57) ABSTRACT

A phase-change memory device including a memory cell having a memory element and a select transistor is improved in heat resistance so that it may be operable at 145° C. or higher.

The memory layer is used which has a content of Zn or Cd of 20 at % or more and 50 at % or less, a content of Ge or Sb of 5 at % or more and 25 at % or less, and a content of Te of 40 at % or more and 65 at % or less in Zn-Ge-Te.

6 Claims, 17 Drawing Sheets

MEMORY DEVICE

TECHNICAL FIELD

The present invention relates to a semiconductor non-volatile memory, and more particularly to a recording device using a phase-change material.

BACKGROUND ART

Heretofore, a non-volatile memory using a phase-change film has been known which is described specifically, for example, in Patent Document 1. This is a phase-change memory in which memory information is written by the change of the state of crystallization of a memory device in accordance with a Joule heat caused by current flowing through the memory device per se. Since a recording layer is once melted at a temperature exceeding 600° C. by Joule heat upon amorphization, while the write current tends to be increased, the resistance value changes as much as from two digits to three digits in accordance with the state of crystallization. Since the resistance value is used as the signal in the memory, a read signal is large and the sensing operation is easy.

FIG. 2 is a schematic diagram illustrating the constitution of a phase-change memory in FIG. 12 of Patent Document 1. The phase-change memory comprises a memory array, a row decoder XDEC, a column decoder YDEC, a read circuit RC, and a write circuit WC. In the memory array, a memory cell MCpr is disposed at each of intersections of word lines WLp (p=1, - - -, n) and data lines DLr (r=1, - - -, m). Each memory cell has a constitution in which a memory device RM and a select transistor QM connected in series are inserted between the data line DL and the ground potential. The word line WL is connected to the gate of the select transistor, and the column select line YSr (r=1, - - -, m) is connected to a corresponding column select switch QAr.

With the constitution described above, the select transistor on the word line selected by the row decoder XDEC is in conduction and a column select switch corresponding to the column select line selected by the column decoder YDEC is in conduction, whereby a current channel is created in the select memory cell to generate a read signal on the common data line I/O. Since the resistance value in the selected memory cell is different depending on the memory information, the voltage outputted to the common data line I/O results in a difference depending on the memory information. By discriminating the difference in the read circuit RC, the memory information in the select memory cell is read out.

On the other hand, Patent Document 2 describes a memory material used for an electric memory device including transition metal elements. While the transition metal elements do not contain, in most cases, the group $2b$ in the existent definition, the group $2b$ is also defined as the transition metal element in this specification. Those containing 10 at % or less of Ti, etc. in a Ge—Sb—Te series material are described in the example.

Further, composition materials for use in a DVD recording surface are described in Patent Document 3, etc.

Patent Document 1: U.S. Pat. No. 5,883,827 specification
Patent Document 2: JP-A No. 2001-502848
Patent Document 3: JP-A No. 2003-081724
Non-Patent Document 1: IEEE International Electron Devices Meeting, TECHNICAL DIGEST, 2001, p. 803-806

DISCLOSURE OF INVENTION

While the phase-change memory expected as a semiconductor non-volatile memory in the next generation uses a recording film material for an optical disk as a phase-change layer, the recording film material of the optical disk typically represented by $Ge_2Sb_2Te_5$ has no sufficient heat resistance as a semiconductor memory required for the use at a higher temperature than that for the optical disk.

Accordingly, it is an object of the present invention to provide a non-volatile memory that has an optimal resistance value and can provide high-temperature operation when it is formed as a device of a small area.

The foregoing object can be attained by using, as a phase-change film, those recording information by causing a reversible phase-change between a crystal phase and an amorphous phase, which contains (1) 2 at % or more and less than 25 at % of at least one element selected from the group consisting of Ge and Sb, (2) 40 at % or more and 65 at % or less of Te, and (3) 20 at % or more and 50 at % or less of at least one element selected from the group consisting of the group $2b$, group $1b$, groups $3a$ to $7a$, and group 8 elements. Those containing both Ge and Sb are particularly preferred.

The reason for containing 40 at % or more and 65 at % or less of Te, and containing 20 at % or more and 50 at % or less of at least one element selected from the group $2b$, group $1b$, groups $3a$ to $7a$, and group 8 elements is to keep high crystallization temperature. A description is to be made of Zn as a typical example of the group $2b$, group $1b$, groups $3a$ to $7a$, and group 8 elements and of Ge as an example of Ge or Sb. In most cases of Zn-containing compositions, since Ge—Te are incorporated in a Ze—Te amorphous network having strong bonding and stable crystal systems are different from each other, it is probable that high crystallization temperature is kept entirely. In this case, it is probable that the covalent bonding tendency is increased more than the strong ionic bonding tendency of ZnTe by the addition of Ge, to make the amorphous network (network structure) less deformable and, on the other hand, crystallization at high speed like domino-toppling once crystallization starts.

FIG. 12 shows the relationship between the addition amount of Zn to $Ge_{25}Te_{75}$ and average melting point. For 20 at % or more and 50 at % or less of Zn, the melting point of the solid-phase portion was 900° C. or higher. The melting point of the solid-phase portion is higher also for 50 at % or higher of Zn. For more than 50 at % of Zn, however, the oxidation resistance lowers abruptly, the memory layer is damaged or peeled during device manufacturing step, and so it is difficult to reach the final step. FIG. 13 shows the relationship between the addition amount of Zn to $Ge_{25}Te_{75}$ and the upper limit temperature for the operation of the memory device to be described in the embodiment. Operation of an element at 145° C. or higher is possible within a range of Zn of 20 at % or more and 60 at % or less. For use in automobile engine control, required specifications of automobile manufacturers is that the memory element is operable at 145° C. or higher, that is, higher than 120° C. which is the upper limit for the operation temperature of usual memory elements. The demand of specifications can be satisfied by the constitution of the present application. On the other hand, the demand of the specification can not be satisfied by the material composition containing 10 at % or less of Ti as described in Patent Document 2.

Further, Cd in the group $2b$, like Zn, shows comparable heat resistance when used instead of Zn. Each of the elements in the group $1b$, groups $3a$ to $7a$, and group 8 can withstand continuous operation within 10 hours when it is contained in the inside of a heat insulating casing since it can withstand 130° C. although the melting point and the crystallization temperature are lower than those of a case containing the group 2b element.

Accordingly, the memory device using the material of the invention exhibits high crystallization temperature, and high temperature operation and storage of memory at high temperature can be expected.

According to the invention, a memory using a phase-change material can exhibit high heat resistance. Since the memory element using the material of the present application can operate at high temperatures, it can be used sufficiently for an application use where the ambient temperature is liable to increase such as vehicle-mounted application use.

BEST MODE FOR CARRYING OUT THE INVENTION

Embodiments are to be described specifically with reference to drawings.

Embodiment 1

Preferred embodiments of the present invention will be below described specifically with reference to the drawings. Circuit devices constituting each of the blocks in the embodiment is not particularly restricted but typically formed by a semiconductor integrated circuit technique such as known CMOS (Complementary MOS transistor), etc. on a semiconductor substrate such as single crystal silicon. Further, a chalcogenide material, etc. showing phase-change is prepared by hybridization with the technique of forming integrated circuits.

[Memory Array Constitution]

Figure 1:
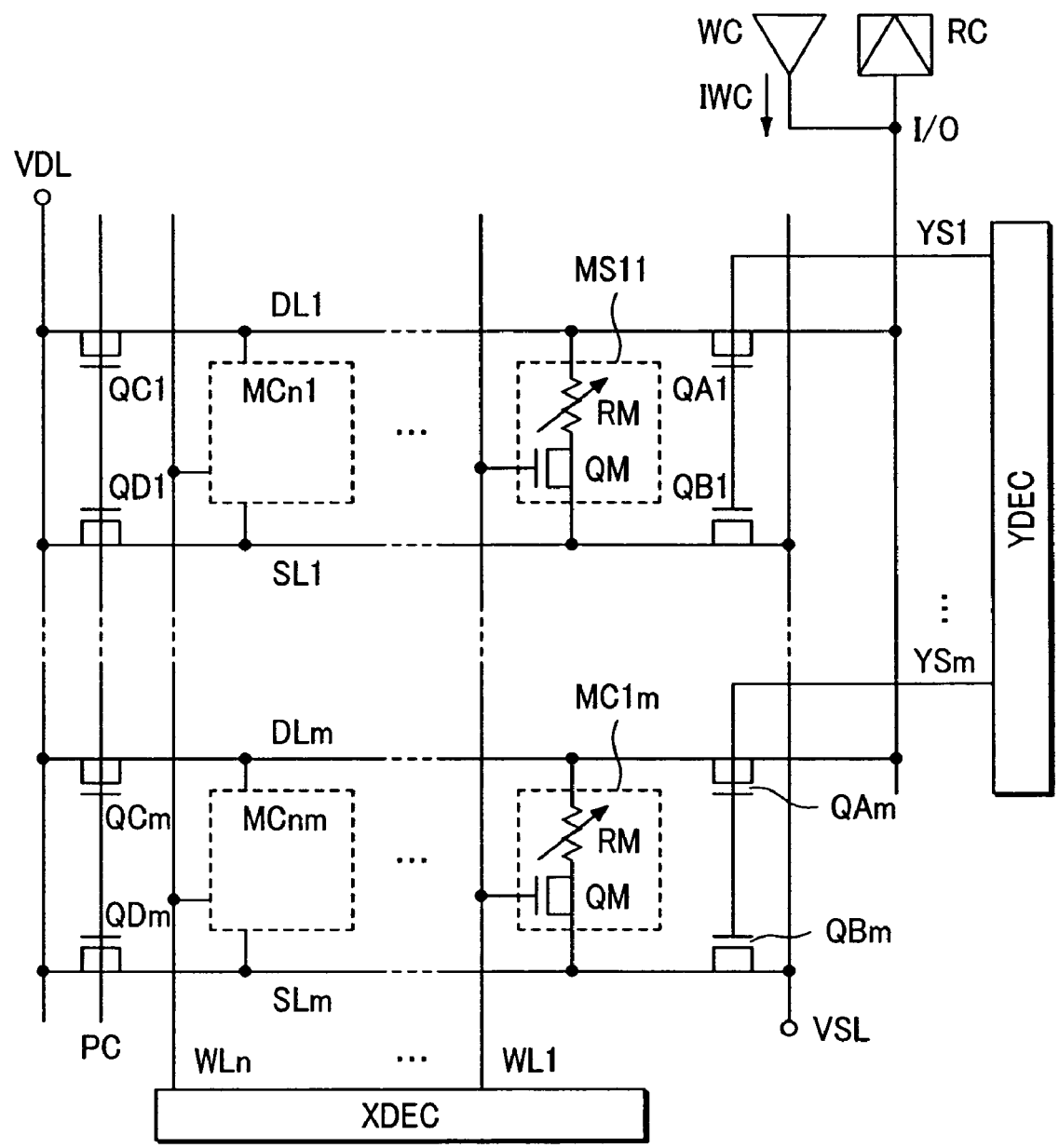
FIG. 1 is a diagram showing a constitutional example of a memory array using a memory cell comprising a memory element the resistance of which changes in accordance with memory information and a select transistor according to the invention.
Figure 2:
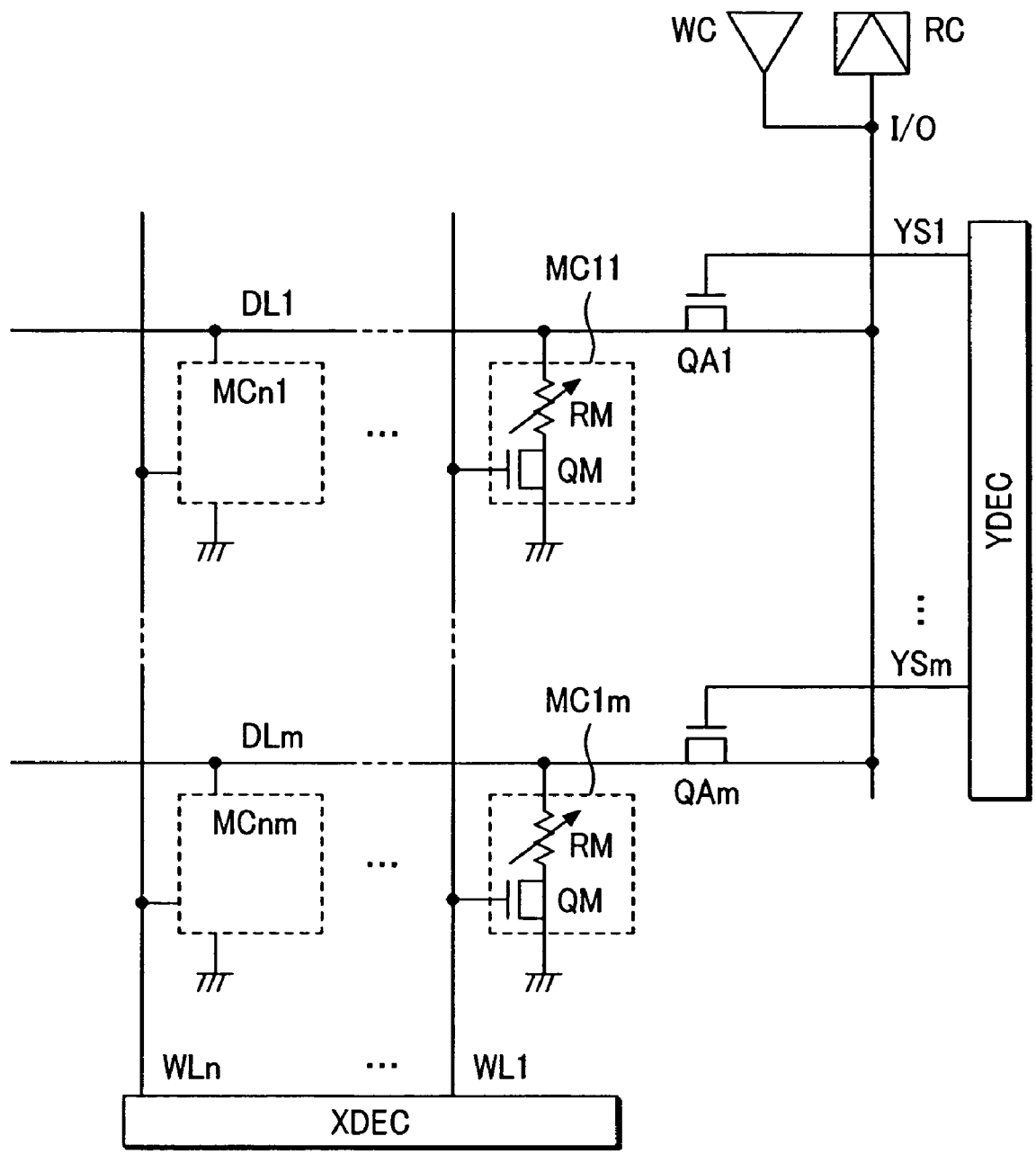
FIG. 2 is a diagram showing an existent example of a memory array constitution using a memory cell comprising a memory element the resistance of which changes in accordance with memory information and a select transistor.

FIG. 1 shows a constitutional example of a memory array according to the invention. In the figure, are also shown a row decoder XDEC, a column decoder YDEC, a read circuit RC, and a write circuit WC necessary for the operation of the memory array. The constitution has a feature of disposing source lines and data lines parallel thereto, and arranging a pre-charge circuit for driving both of them to an equi-potential and a circuit for selectively driving a select source line, thereby generating a current channel only in a selected cell at the intersection between a selected word line and a selected source line. For the memory array, a constitution like in FIG. 2 having a memory cell of n×m bits is shown. The element constituting the memory cell is a select transistor QM and a memory element RM of a variable resistor made of a chalcogenide material.

The row decoder XDEC selects a word line WL in accordance with a row address. Further, the column decoder YDEC drives a column select line YS in accordance with a column address. A memory cell selected by the conduction of a column select switch QA in accordance with the selected column select line YS, is connected by way of a common data line I/O to the read circuit RC and the write circuit WC. In this case, QA1 to QAm can be regarded as a first switch circuit for selecting one of a plurality of data lines (DL1 to DLm) and connecting the selected data line to a common data line. Further, QB1 to QBm can be regarded as a second switch for selecting one of a plurality of source lines (DS1 to DLm) and connecting the selected source line to a source voltage supply line.

The memory array constitution has the following three features. At first, a plurality of (the number of m in this case) source lines SLr (r=1, - - - , m) are arranged parallel with the data line DL and sources of transistors QM in the column direction are connected in common with the source line SL. Secondly, a plurality of (the number of m) NMOS transistors QBr (r=1, - - - , m) are respectively inserted between the source lines SLr and the source voltage terminals (VSL) and are selected by the column decoder. FIG. 1 shows an example in which the column select line Ysr associated with the gates is connected directly thereto. Thirdly, a plurality of (the number of m) NMOS transistors QCr and QDr (r=1, - - - , m) for driving corresponding data lines DL and the source lines SL to a pre-charge voltage VDL are disposed, and a pre-charge enable signal PC is connected to the gates of the transistors.

With the constitution described above, among the pluralities of data lines DL and source lines SL driven to the pre-charge voltage VDL, a source line corresponding to a data line intended to be selected can be driven. That is, a voltage difference can be applied only to the memory cell connected with the data line and source line intended to be selected. Accordingly, it is possible to create a current channel only in the desired memory cell on the selected word line and produce a read signal only at the selected data line.

The pre-charge circuit can be regarded as the entire of QC1, QD1 to QCm, QDm, and QC1 and QD1 can be regarded as an element pre-charge circuit disposed for each pair of DL1 and SL1.

[Characteristic of Memory Device]

Figure 3:
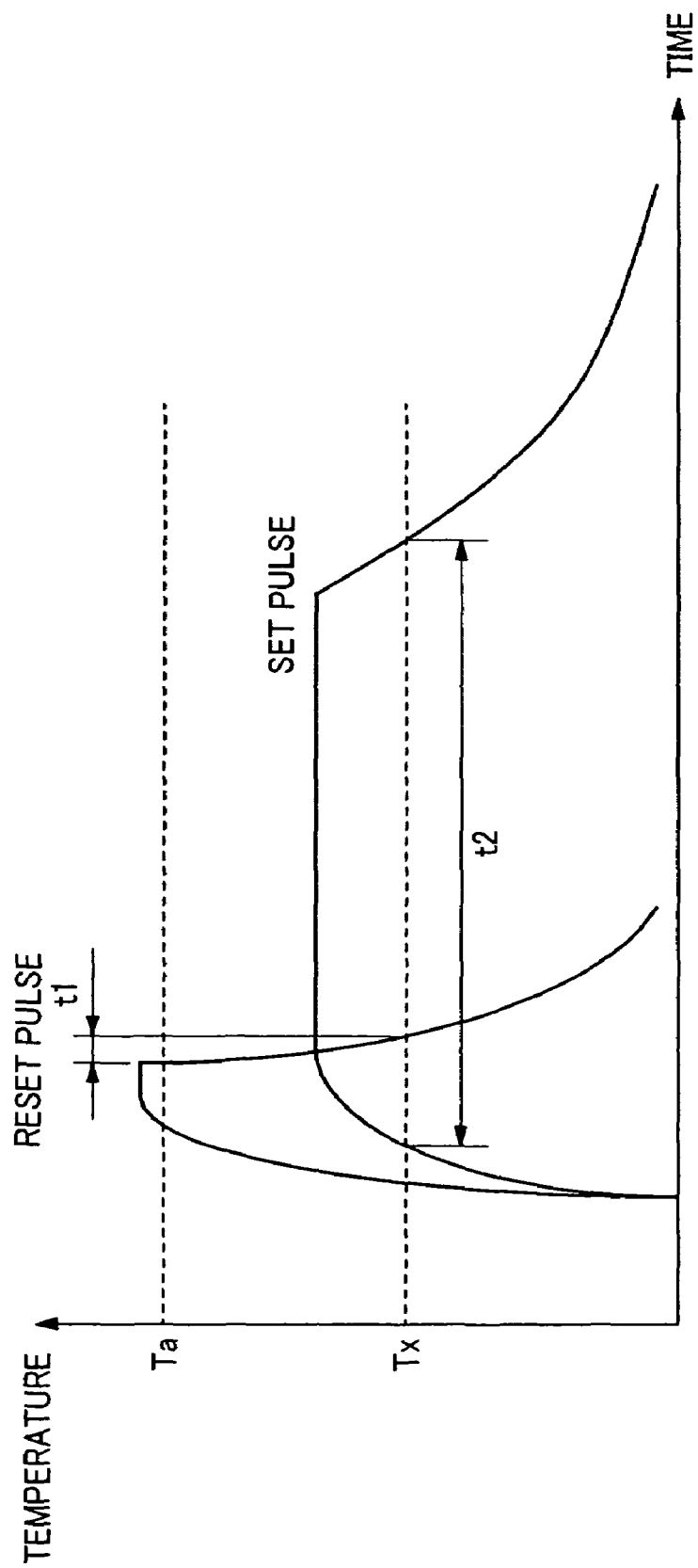
FIG. 3 is a graph showing the relationship between a pulse width and temperature necessary for the phase-change of a memory element.

In the memory element, a chalcogenide material such as Zn—Ge—Te series containing at least zinc (Zn), germanium (Ge), and tellurium (Te) is used as a memory material. The features of this material is as follows: The material can be used at higher temperatures since both the melting point and the crystallization point are much higher compared with those of the material such as Ge—Sb—Te series which have been put to experiment so far for memory element; the material has high electric resistance; and the material has high optical transmittance and exhibits no large change in the complex refractive index due to phase-change with an optical point of view. The characteristic of the phase-change memory using the chalcogenide material is described, for example, in Non-Patent Document 1. The chalcogenide means materials containing at least one element of sulfur, selenium, and tellurium. In a case of writing memory information $0'$ to the memory element, as shown in FIG. 3, a reset pulse is applied that heats the element to a melting point Ta of the chalcogenide material or higher and is followed by quenching. By decreasing the entire energy to be given by shortening the reset pulse and setting the cooling time t1 shorter, for example, to about ins, the chalcogenide material is formed into an amorphous state at high resistance. On the other hand, in a case of writing memory information $1'$, by applying a set pulse of keeping the memory element in a temperature region lower than the melting point of the memory element and higher than the crystallization temperature Tx equal with or higher than the glass transition point thereof, the chalcogenide material is formed into in a ply-crystal state at low resistance. The time t2 required for crystallization varies depending on the composition of the chalcogenide material and it is, for example, about 50 ns. The temperature of the element shown in the figure depends on the Joule heat generated from the memory element per se and heat diffusion to the periphery. Accordingly, as shown by the I-V characteristic in FIG. 4, by applying a current pulse at a value in accordance with the writing information to the memory element, the crystallization state of the memory element is controlled. The figure schematically shows the operation principle of the memory element using the chalcogenide material, showing that memory information $1'$ is written in a case of applying a set current within a range from IW1 to IW0 and memory information $0'$ is written in a case of applying a reset current at IW0 or higher. However, each of the states may be $0'$ or $1'$. Four types of write operations are to be described specifically with reference to the figure.

Figure 4:
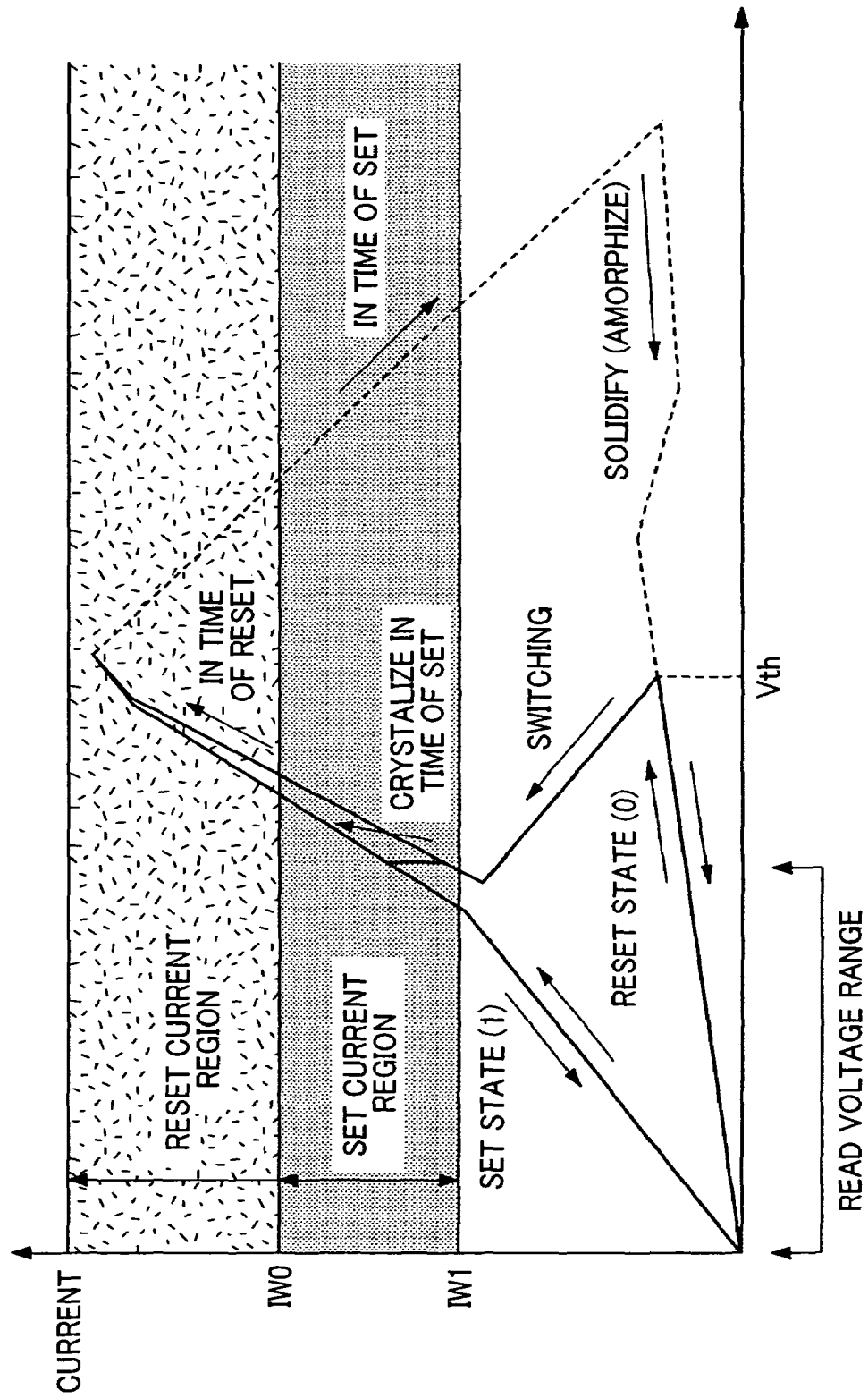
FIG. 4 is a diagram showing a current-voltage characteristic of a memory element.

At first, in a case of conducting $1'$ writing to a memory element in an initial state $1'$, when a set current is applied, since the memory element reciprocates between the initial state and the set region along a low resistance curve in a set (crystallized) state, the state is maintained. Secondly, in a case of conducting $0'$ writing to the memory element in the initial state $1'$, when a reset current is applied, the memory element goes along the low resistance curve in the set state to reach a reset current. Then, since melting starts partially by the Joule heat, the conductivity lowers gradually. When melting proceeds further, the memory element is formed into a high resistance state. When the memory element in a liquid state is quenched, since it phase-changes into an amorphous state, the memory element goes along a high resistance curve in a reset (amorphous) state somewhat lower than the resistance in the liquid phase and returns to the initial state. A portion shown by a dotted line in FIG. 4 is an imaginal line assuming the change of the current due to the change of the resistance value if the voltage were applied continuously although the reset pulse has already been ceased. Thirdly, in a case of conducting $1'$ writing to the memory element in the initial state $0'$, when a set current is applied, the memory element switches to a low resistance state when the terminal voltage of the memory element exceeds a threshold voltage Vth. After switching, crystallization proceeds by Joule heat. When the current value reaches the set current, since the crystallization range is widened to cause phase-change and the resistance value is lowered further, the memory element goes along the low resistance curve and returns to the initial state. The voltage-current curve inclines moderately in the midway, because the region switched to the low resistance state is switched OFF, and only the resistance lowering due to crystallization remains. Fourthly, in a case of conducting $0'$ writing to the memory element in the initial state $0'$, there is scarcely a time for crystallization after the switching and the memory element reaches along the low resistance curve by switching to reach the reset region, and is melted, quenched and solidified to return to the initial state.

In view of the operation principle of the memory element, operation has to be conducted while suppressing the voltage, at the highest, to lower than the voltage Vth so as not to destroy the memory information upon reading.

Actually, since the threshold voltage also depends on the voltage application time and it tends to lower as the time is longer, it is necessary that the voltage does not exceed the threshold voltage within the read time and not cause switching to the low resistance state. Then, operation of attaining the memory array constitution shown in FIG. 1 based on the principle described above is to be described below.

[Read Operation]

Figure 5:
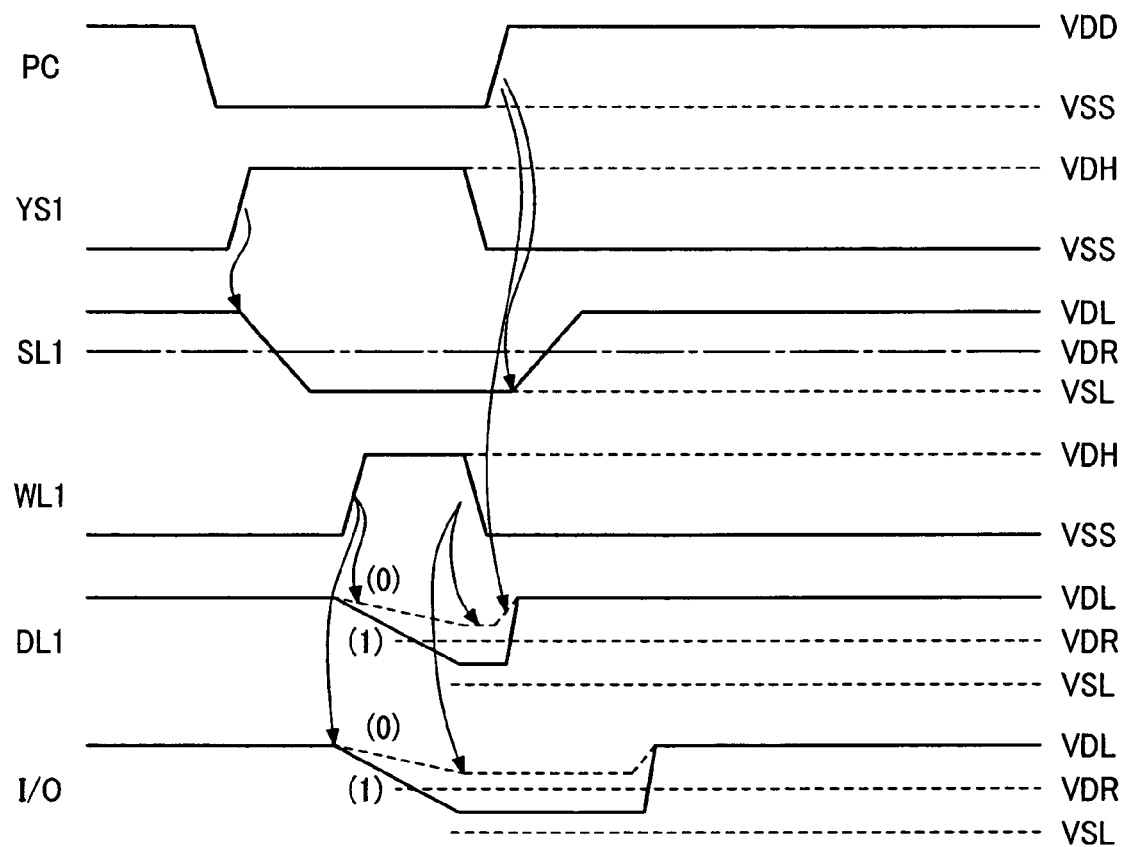
FIG. 5 is a diagram showing read operation timing of a memory array according to the invention.

Then, in accordance with FIG. 5, read operation for the memory cell using the array constitution shown in FIG. 1 is to be described. FIG. 5 shows an operation waveform in a case of selecting a memory cell MC11.

At first, in a stand-by state, since a pre-charge enable signal PC is held at a power source voltage VDD (for example, 1.5 V), the data line DL and the source line SL are kept at the pre-charge voltage VDL by NMOS transistors QC and QD. VDL is a value lowered from VDD by a threshold voltage of the transistor, which is, for example, 1.0 V. Further, also the common data line I/O is pre-charged to the pre-charge voltage VDL by the read circuit RC.

When the read operation is started, the pre-charge enable signal PC at the power source voltage VDD is driven to the ground potential VSS, and the column select line YS1 at the ground potential VSS is driven to the increased potential VDH (for example, 1.5 V or higher), so that transistors QA1, QB1 come into conduction. In this case, since the data line DL1 is at an equi-potential with the common data line I/O, while it is kept at the pre-charge voltage VDL, the source line SL1 is driven by the transistor QB1 to the source voltage VSL (for example, 0.5 V). For the source voltage VSL and the pre-charge voltage VDL, the pre-charge voltage VDL is higher than the source voltage VSL, and the difference is set to such a relation that the terminal voltage for the resistor RM is kept within a range of the read voltage region as shown in FIG. 4. Then, when the word line WL1 at the ground potential VSS is driven to the increased potential VDH, transistors QM in all of the memory cells on the word line WL1 come into conduction. In this case, a current channel is generated in the memory cell MC11 in which a potential difference is caused to the memory device RM, and the data line DL1 and the common data line I/O are discharged to the source voltage VSL at a speed in accordance with the resistance value of the memory element RM. In the figure, since the resistance value is smaller in the case of keeping the memory information 1' than in the case of keeping memory information 0', the discharge is faster. Accordingly, a signal voltage in accordance with the memory information is generated. In the non-selected memory cells MC12-MC1m, since the potential difference for the memory element RM is 0, the non-selected data lines DL12 to DL1m are kept at the pre-charge voltage VDL. That is, only the memory MC11 selected by the word line WL1 and the source line SL1 supplies the reading current through the data line DL1.

Then, after discrimination of the read information in the read circuit RC, the word line WL1 can be lowered. When the word line WL1 is kept to be raised continuously in a case where discrimination is late, the selected data line DL1 is discharged to the vicinity of the source voltage VSL also in a case of reading the memory information 0' and the difference between the signal voltage for conducting 0' reading and signal voltage for conducting 1' reading is decreased and information can not sometimes be read correct. In such a case, erroneous operation can be prevented by lowering the word line WL1 at the timing before the data line voltage exceeds the reference voltage VDR in a case of 0' reading as shown in the figure. Since the signal voltage on the common data line I/O can be kept by lowering the word line to interrupt the current channel, the read circuit RC can discriminate the positive or negative signals generated based on reference voltage VDR. After the read operation described above has been completed, the common data line I/O is driven to the pre-charge potential VDL and returns to the stand-by state.

In the stand-by state, in a case where the data line and the source line in the memory array is in a floating state, when the data line and the common data line are connected upon starting of the read operation, the capacity of the data line for which the voltage is not defined is charged from the common data line. Therefore, the data line and the source line are driven to the pre-charge potential VDL into a stand-by state by lowering also the column select line YS1 in accordance with the word line WL1 and, further, driving the pre-charge enable signal PC at the ground potential VSS to the power source voltage VDD in this figure. Further, the increased potential VDH is a voltage used generally in existent DRAM, and set so as to satisfy the relation: VDH>VDD+VTN by using the power source voltage VDD and the threshold voltage VTN of the NMOS transistor. For example, in the write operation to the phase-change memory, it is necessary to supply a higher current than that in the read operation as will be described later. In this invention, a correct write operation can be conducted by driving the word line WL and the column select line YS to the increased potential VDH to lower the resistance of the NMOS transistor. Further, by setting the pre-charge voltage VDL to a level higher than the source voltage VSL, the selected source line can be the source of the transistor QM in the selected memory cell and the gate-source voltage of the transistor can be ensured irrespective of the resistance of the memory element RM. Further, also in a reversed potential relation, the same selecting operation is possible providing that the difference is set so as to be within the range of the read voltage as shown in FIG. 3.

While FIG. 5 is an example of driving the word line WL1 after driving the source line SL1, the source line SL1 may be driven after driving of the word line WL1 depending on the convenience of the design. In this case, since the word line WL1 is driven at first to bring the select transistor QM into conduction, the terminal voltage on the memory element RM is kept at 0 V. Then, when the source line SL1 is driven, while the terminal voltage on the memory element RM increases from 0 V, the value can be controlled by the driving speed of the source line SL1 and contained within the range of the read region described above.

Likewise, the word line WL1 and the source line SL1 can also be driven substantially simultaneously. Further, for the word line WL1 and the source line SL1, when the column select line YS1 is driven prior to the pulse of a later driving timing, since the output waiting time to I/O can be decreased, the access time can be made faster. It will be apparent that the wire connection may be changed such that the transistors QA1 and QB1 shown in FIG. 1 can be driven independently.

While the example of selecting the memory cell MC11 has been shown, memory cells on the same data line are not selected since the word line voltage for them is fixed to the ground potential VSS. Further, since other data lines and source lines are at the same potential VDL, remaining memory cells are also kept in a state of not-selected cell.

In the foregoing description, it is assumed that the word line in the stand-by state is at the ground potential VSS and the source line in the selected state is at a positive source voltage VSL of 0.5 V. The voltage relation is set such that the current flowing through the not-selected memory cell has no effects on the operation. That is, this voltage relation may be set such that the transistors QM in the not-selected memory cells MC21 to MCnl are turned-off reliably when the source line is selected and the word line selects a not-selected memory cell, for example, the memory cell MC11. As shown herein, the threshold voltage of the transistor QM can be lowered by setting the word line voltage to the ground potential VSS and the source voltage VSL to a positive voltage in the stand-by state. Depending on the case, it is also possible to set the selected source line to the ground potential 0 V and the word line in the stand-by state to a negative voltage. Also in this case, the threshold voltage of the transistor QM can be lowered. While it is necessary to generate a negative voltage for the word line in the stand-by state, since the voltage for the source line in the selected state is the ground potential VSS applied externally, it can be stabilized easily. In a case where the threshold voltage of the transistor QM is made sufficiently high, the source line in the selected state and the word line in the stand-by state may be set to the ground potential 0 V. In this case, since this is the ground potential VSS applied externally and the capacitance of the word line in the stand-by state acts as a stabilizing capacitance, the voltage on the source line in the selected state can be further stabilized.

Further, while the description has been made of the operation of discriminating the signal voltage read out to the common data line I/O by the read circuit RC, an operation of discriminating the current flowing to the common data line I/O is also possible. In this case, a sense circuit with low input impedance as described, for example, in Patent Document 1 is used. By such current sensing system, the effect of the wiring capacitance of the common data line can be decreased to shorten the read time.

[Write Operation]

Figure 6:
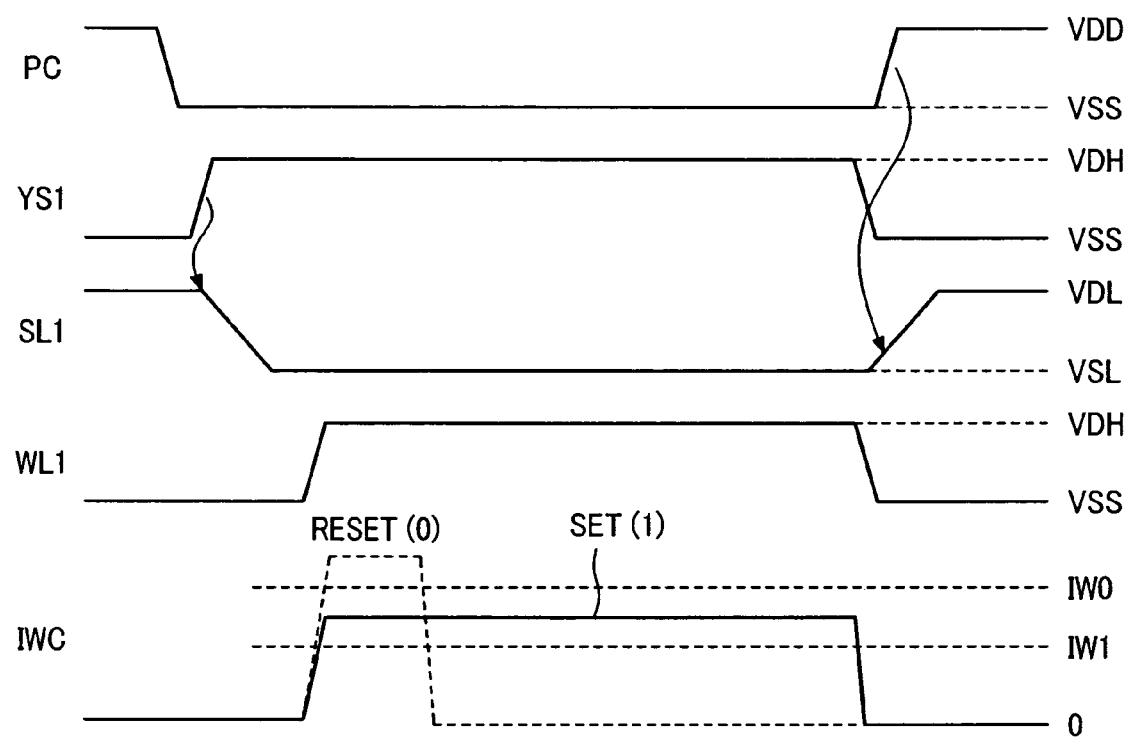
FIG. 6 is a diagram showing write operation timing of a memory array according to the invention.

Further, a description is to be made of the write operation of the memory cell using the array constitution shown in FIG. 1. However, FIG. 6 shows an operation waveform in a case of selecting the memory cell MC11.

At first, the operation of selecting the memory cell MC11 is conducted in the same manner as in the read operation. When the memory cell MC11 is selected, the write circuit WC drives the common data line I/O to generate a write current WC. In a case of '0' writing, a reset current set to a value in the range shown in FIG. 4 is applied to the memory cell C11. The reset current has a short pulse width and it returns to the stand-by state immediately after driving and the current value becomes 0. By the reset current described above, the same Joule heat as that by the reset pulse shown in FIG. 3 is generated. On the contrary, in a case of '1' writing, a set current set to the value in the range shown in FIG. 4 is applied. The pulse width is about 50 ns. By the set current described above, the same Joule heat as that by the set pulse shown in FIG. 3 is generated. As described above, since the application time and current value of the write pulse are controlled by the write circuit WC, the memory cell is in a selected state for a pulse width of the set current in the writing of either of memory information.

[Memory Cell Structure]

An example of the memory array structure will be described. The feature of the structure is that the active region of the MOS transistor is disposed obliquely to the word line, the data line, and the source line. A memory structure is constructed by wiring the source line with a first metal layer and the data line with a second metal layer, and disposing the source line corresponding to the data line.

Figure 7:
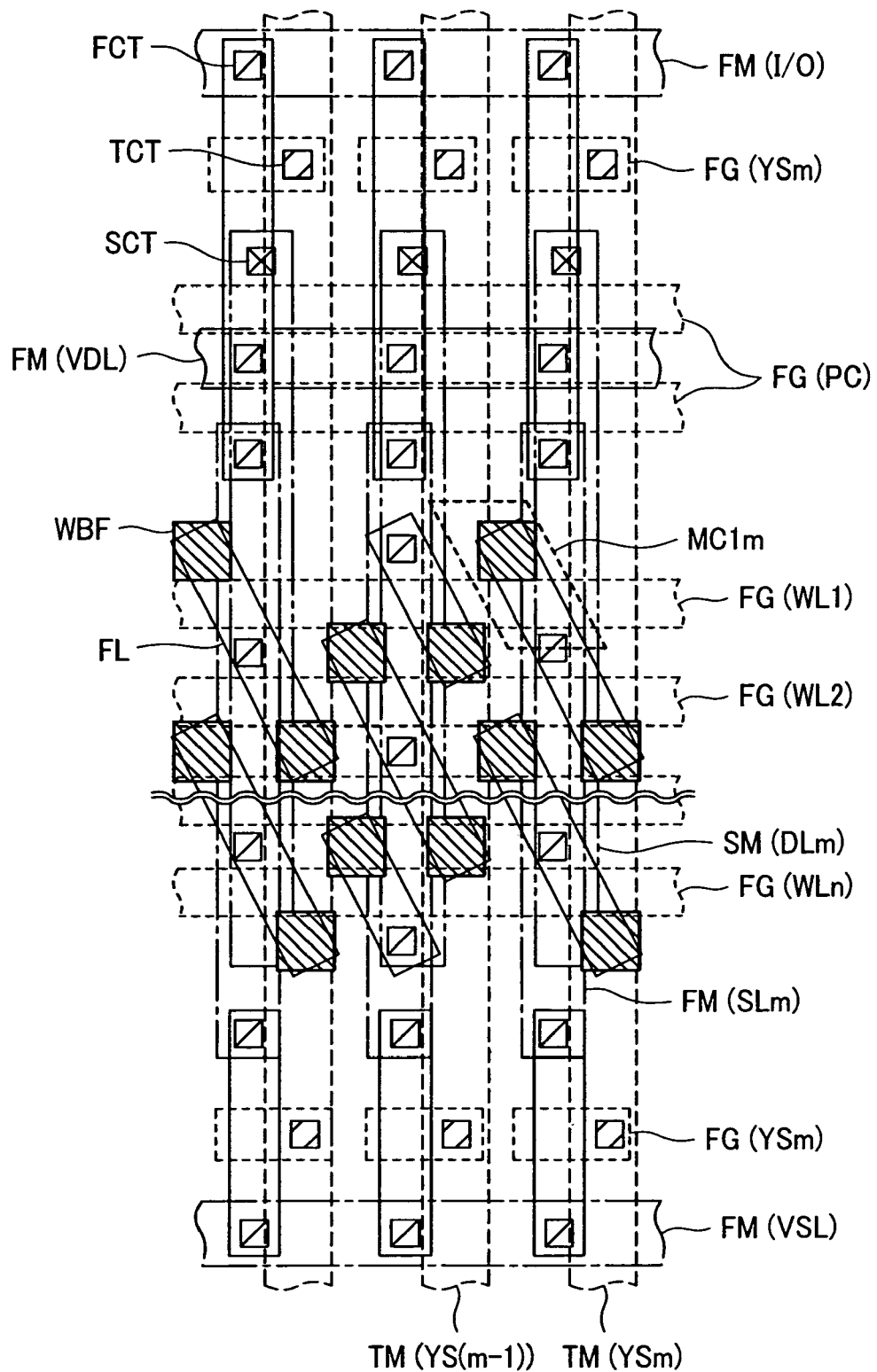
FIG. 7 is a diagram showing the layout of a memory array according to the invention.

FIG. 7 shows a layout of the memory array structure. In the figure, FL is an active region pattern. FM is a first metal layer pattern for source lines SL, power source feed lines or the like. SM is a second metal layer pattern for data lines DL. TM is a third metal layer pattern for column select lines YS. FG is a first gate electrode pattern for a transistor formed above a silicon substrate. FCT is a first metal layer contact pattern. SCT is a second metal layer contact pattern. TCT is a third metal layer contact pattern. WBF is an upper electrode layer of a memory device. For the patterning, well-known photolithography can be used. Memory devices are formed below each of the upper electrode layers WBF. Further, since corresponding node names are indicated in parentheses after the pattern names, it will be easily understood that, for example, the memory cell MC1m is disposed to the position at the intersection between the word line WL1, the data line DLm, and the source line SLm.

Figure 8:
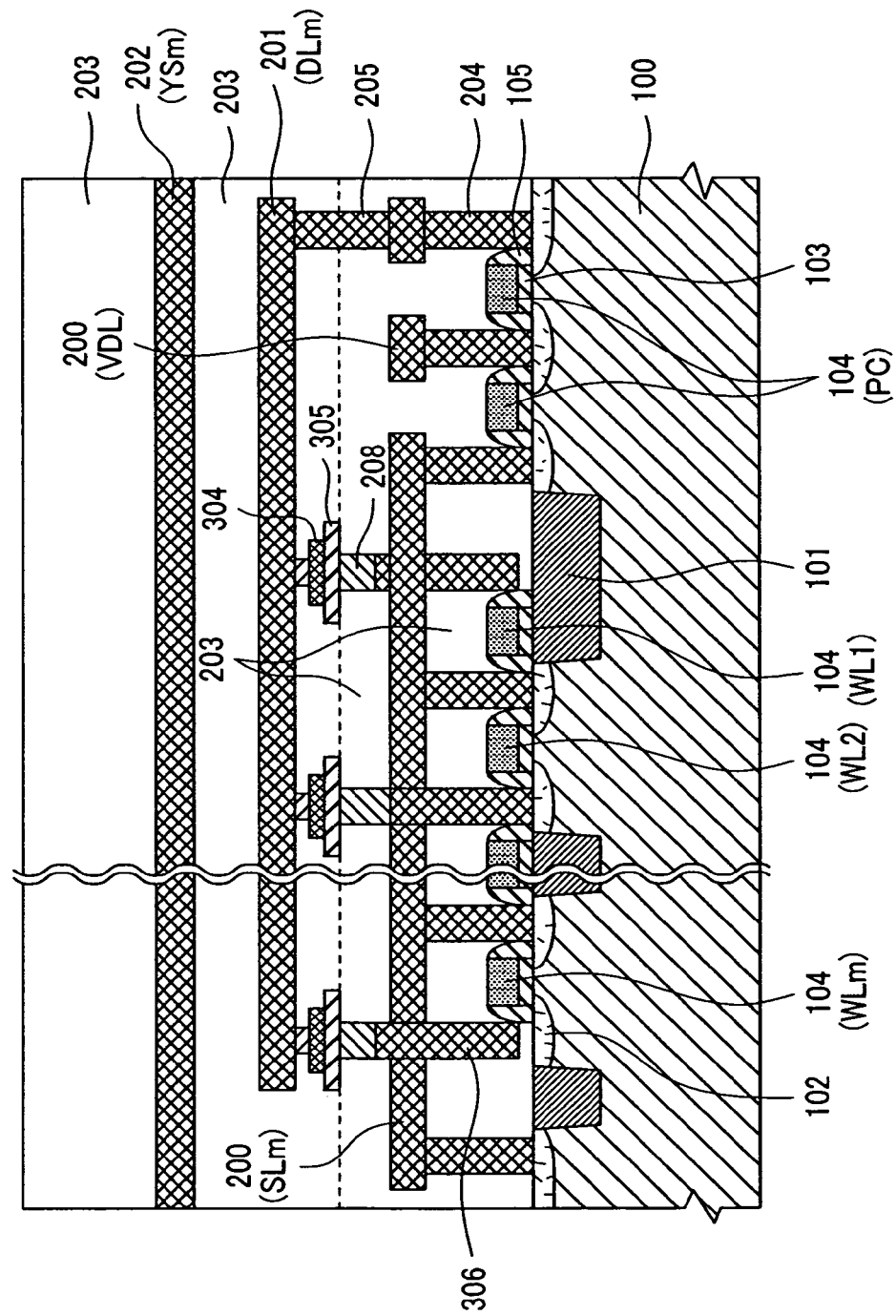
FIG. 8 is a cross-sectional view schematically showing the structure of the memory array shown in the layout diagram of FIG. 7.

FIG. 8 is a view schematically showing a cross section of the memory array in a direction perpendicular to the data line. Reference numeral 100 denotes a P-semiconductor substrate. Reference numeral 101 denotes an insulator for device isolation buried in the P-semiconductor substrate. Reference numeral 102 denotes an N-diffusion layer region in the active region pattern FL in FIG. 7. Reference numeral 103 denotes a gate oxide film of a transistor formed above the substrate. Reference numeral 104 denotes a gate electrode of the transistor formed above the substrate. Reference numeral 105 denotes a side wall formed of an insulating film to a transistor formed above the substrate. Reference numeral 200 denotes a first metal layer used for a source line SL or a power source feed line or the like. Reference numeral 201 denotes a second metal layer used, for example, for a data line DL. Reference numeral 202 denotes a third metal layer used for a column select line YS. Reference numeral 203 denotes an interlayer insulating film. Reference numeral 204 denotes a contact for connecting the N-diffusion layer region 102 and the first metal layer. Reference numeral 205 denotes a contact for connecting the first metal layer and the second metal layer. Reference numeral 208 denotes a Ti—Al—N layer as a lower heater material for the memory device RM. Reference numeral 304 denotes a $W_{80}Ti_{20}$ upper electrode. Reference numeral 305 denotes a chalcogenide material film forming the memory device RM. Reference numeral 306 denotes a contact for connecting the lower heater material 208 and an N-diffusion layer region 102. The upper electrode is made smaller than that of the chalcogenide material film so that heat dissipation from the chalcogenide material film does not increase excessively thereby increasing the reset current. As shown in FIG. 8, node names are shown in the parenthesis on the right side of the layer names assuming that the data line DLm and the source line SLm are viewed from the array end. For example, arrangement for the select transistor and pre-charge transistor QCm and QDm can be understood easily by the node names for the gate electrode shown by 104 in FIG. 8.

The metal layer and the contact are formed, for example, of tungsten with a high melting point or alloys thereof such as $W_{80}Ti_{20}$ in order to prevent deterioration of the electric characteristic caused by the heat treatment upon forming the upper layer portion and prevent chemical reaction or mutual diffusion between the chalcogenide material and the electrode during multiple rewriting. Further, the contact is formed so as to bury the gap relative to the side wall 105. The fabrication technique is referred to as a self-alignment process adopted generally for existent DRAMs.

The memory device according to this embodiment has a high resistance value since the area of contact between the chalcogenide material 304 and the lower heater material 206 is made smaller by using the insulating film 305 as shown in FIG. 8. Accordingly, since high Joule heat can be generated by a small current, a phase-change memory capable of write operation at low-power can be obtained. Further, since the word line lines can be arranged at a minimum pitch 2F (F is a minimum fabrication size) and the data lines can be arranged at 3F pitch which is 1.5 times as large as the word line according the layout shown in FIG. 7, a phase-change memory cell having an area six times the square of F can be attained.

The effects due to the constitution and the operation of the memory array and the memory cell are to be summarized below. The memory array according to this embodiment has a constitution as shown in FIG. 1. In the constitution, the source lines SL are provided in parallel with the data lines DL, and the source of the select transistor QM in the memory cell is connected with the corresponding source line SL. This results in reduction of the power consumption in the read operation. Specifically, the select transistors QA and QB are arranged to the data lines DL and the source lines SL respectively. Further, transistors QC and QD for pre-charging are disposed respectively. With such a constitution, the source line corresponding to the selected data line can be driven to the source voltage VSL. Accordingly, the current channel can be formed only to the cell at the intersection between the selected word line and the selected source line to generate read signal only for the selected data line. Accordingly, by suppressing the chare/discharge of data lines which are not selected, the power consumption can be decreased, for example, in the read operation of phase-change memory or MRAM. In a case of applying the invention to the phase-change memory, since the same selecting operation as in the read operation is conducted also in the write operation, a phase-change memory of low power consumption as a whole can be attained.

Further, in the memory array according to this embodiment, since the potential of data line which are not selected can be maintained by the selecting operation as described for the first effect, noise due to the capacitive coupling between the data lines is small, and stable read signal can be generated. Accordingly, a phase-change memory of stable read operation can be attained.

(Memory Cell Structure Using Longitudinal Transistor)

Then, another example of a memory array structure is to be described. The feature of the structure is that an MOS transistor with a longitudinal structure is used as the select transistor QM in the sub-array shown in FIG. 1.

Figure 9:
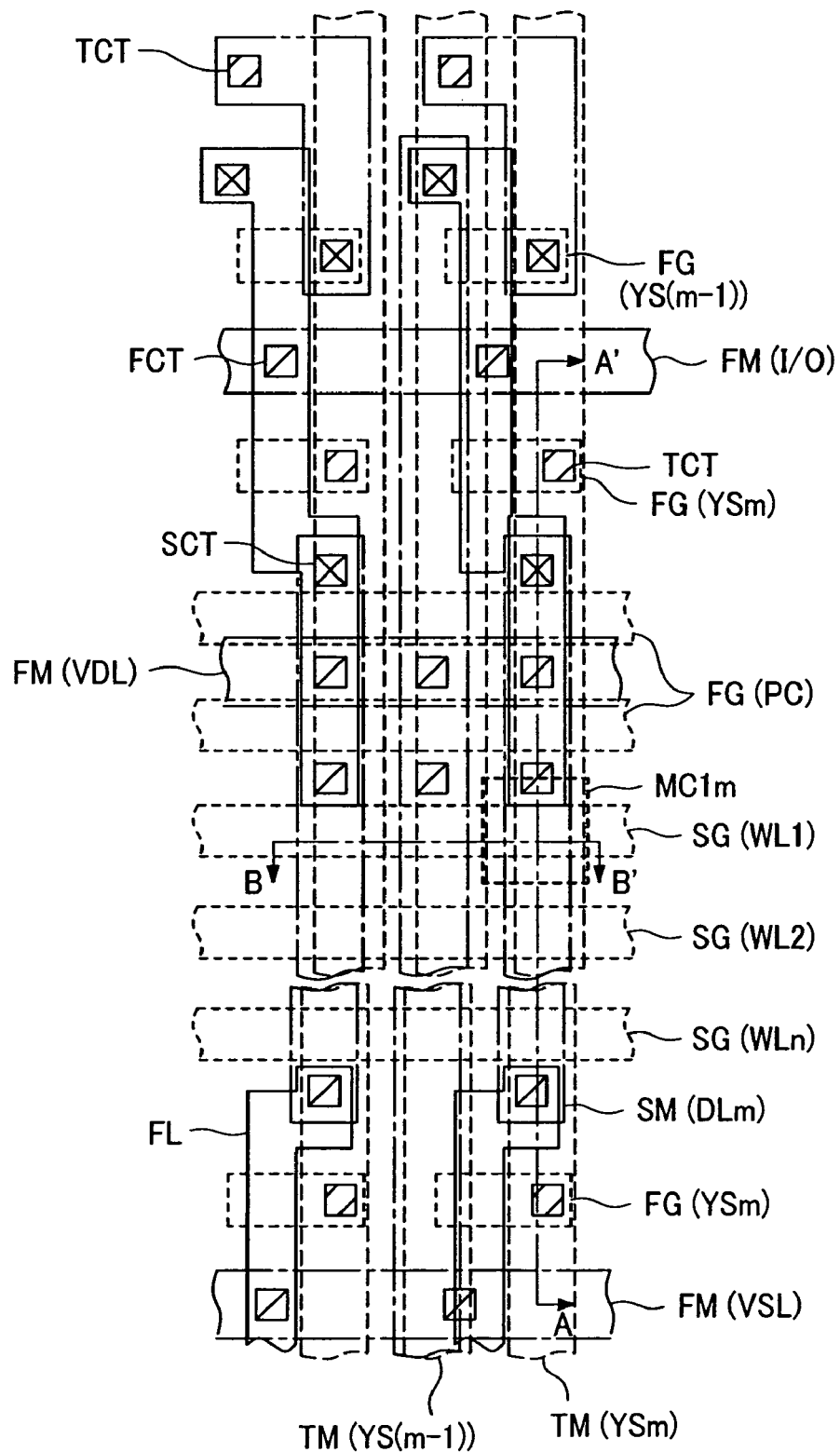
FIG. 9 is a diagram showing another layout of the memory array according to the invention.

FIG. 9 shows a layout of the memory array structure. In the same manner as shown in FIG. 7, FL is an active region pattern. FM is a first metal layer pattern such as for source lines SL. SM is a second metal layer pattern for data lines DL. TM is a third metal pattern for column select lines YS. FG is a first gate pattern of a transistor formed on a silicon substrate. SG is a second gate electrode pattern for word lines WL, that is, a longitudinal transistor. FCT is a first metal layer contact pattern. SCT is a second metal layer contact pattern. TCT is a third metal layer contact pattern. A longitudinal transistor and a chalcogenide are stacked in a region where the second gate electrode pattern SG and the second metal layer pattern SM cross to each other, forming a memory cell. For the patterning described above, well-known photolithography can be used. In the drawing, line A-A' is shown above the data line DLm and line B-B' is shown above the data line WL1 and corresponding node names are shown in the parentheses after the pattern names.

For example, it can be easily understood that the memory cell MC1$m$ is disposed to the position shown at the intersection between the word line WL1 and the data line DLm.

Figure 10:
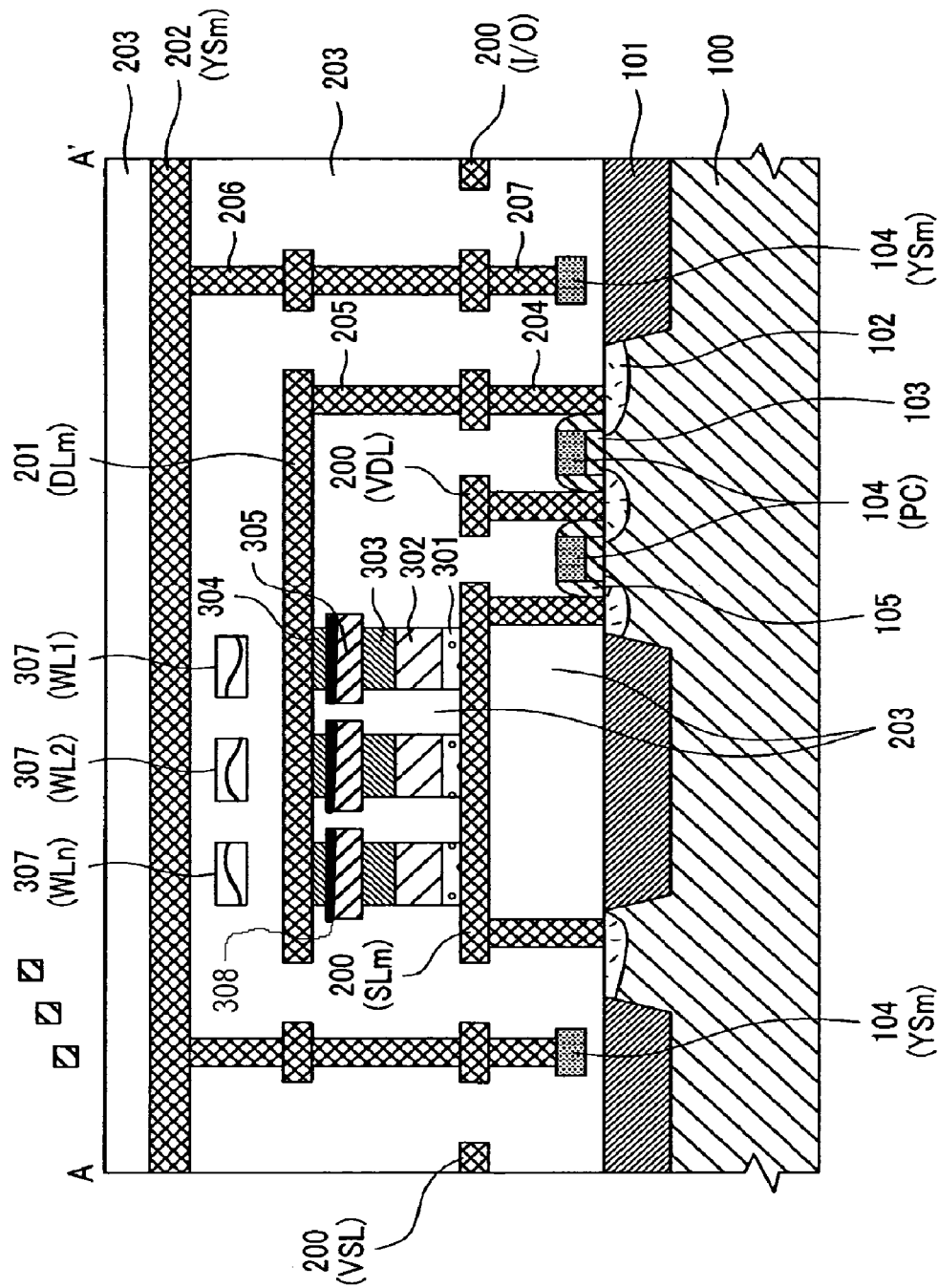
FIG. 10 is a cross-sectional view showing a structure of a portion taken along line A-A' shown in the layout diagram of FIG. 9.

FIG. 10 shows a cross section for a portion along line A-A' line shown in FIG. 9 (hereinafter referred to as A-A' cross section). In the drawing, reference numeral 100 denotes a p-semiconductor substrate. Reference numeral 101 denotes a device isolation insulator buried in the p-semiconductor substrate. Reference numeral 102 denotes an N-diffusion layer region in the active region pattern FL shown in FIG. 9. Reference numeral 103 denotes a gate oxide film of a transistor formed above the substrate. Reference numeral 104 denotes a gate electrode for a transistor formed above the substrate. Reference numeral 105 denotes a side wall formed with an insulating film to the transistor formed above the substrate. Reference numeral 200 denotes a first metal layer used for source line SL, power supply feed line, common data line I/O, etc. Reference numeral 201 denotes a second metal layer used for data line DL, etc. Reference numeral 202 denotes a third metal layer-used for column select line YS. Reference numeral 203 denotes an inter-layer insulating film. Reference numeral 204 denotes a contact for connecting the N-region layer 102 and the first metal layer. Reference numeral 205 denotes a contact for connecting the first metal layer and the second metal layer. Reference numeral 206 is a contact for connecting the second metal layer and the third metal layer. Reference numeral 207 denotes a contact for connecting the first metal layer and the gate electrode 104 of the transistor formed above the substrate. Reference numeral 208 denotes a resistive heat generating layer comprising ZnTe. It may be also a material having TnZe with addition of 10 at % or less of other elements, particularly, group 3 to 5 elements. Further, reference numeral 301 denotes N-polysilicon forming the source electrode for a longitudinal transistor PM. Reference numeral 302 denotes intrinsic polysilicon with no addition of impurity forming the channel of the longitudinal transistor PM. Reference numeral 303 denotes N-polysilicon forming the drain electrode of the longitudinal transistor PM. Reference numeral 305 denotes a chalcogenide material forming the memory device RM. Reference numeral 304 denotes an upper electrode. Reference numeral 307 denotes a gate electrode of the longitudinal transistor, that is, the word line WL.

In a case of thinly forming a dielectric material layer such as of oxide, nitride, sulfide, or carbide, or a mixed film of the dielectric material and a chalcogenide material between the chalcogenide material for memory and one of the electrodes or a resistive heater material layer, since a filament-like region of the chalcogenide is formed in the dielectric material of the region as a fine conductive path upon first setting to low resistance state, and current flows only therein to cause phase-change, a high resistance value and a low operation current value can be obtained. A preferred dielectric material is a material including, as a main ingredient (containing 60% or more), one of germanium oxide, germanium nitride, silicon oxide, silicon nitride, aluminum nitride, titanium nitride, aluminum oxide, titanium oxide, chromium oxide, tantalum oxide, molybdenum oxide, silicon carbide, and zinc sulfide, or a material as a mixture thereof. The mixed film region 308 is preferably in contact with one of the electrodes (for example, 304). It is most preferred that the mixed film region is disposed in contact with a negative electrode with respect to stability of the memory operation since the filament is formed by positive ions. The operation, however, is possible in a state where the mixed film region is not in contact with both electrodes. In the case of using a mixed layer of the dielectric material and the chalcogenide, the effect of increasing the resistance was not observed unless the content of the chalcogenide was 60 mol % or less. In this embodiment, a film with a thickness of 5 nm consisting of a mixture of 70% of $Ta_2O_5$ and 30% of a memory layer material was disposed.

Within the range of the film thickness from 2 nm to 25 nm, it was ensured that an increase in the resistance was twice or more while keeping the resistivity at one digit or more. However, in a case where the film is thin, there is no problem since pinholes are inherently present in the dielectric material layer to which the chalcogenide material intrudes. In the case of a film with a thickness of 15 nm or more, however, it is necessary to at first apply a voltage of 1.5 times higher than the stable operation temperature to cause dielectric breakdown and form filaments. The method of providing the layer in which the filamentous region is always formed and the effect thereof are also in common with the case of using a memory layer out of the range of the material composition for the memory layer of the invention, for example, a $Ge_2Sb_2Te_5$ memory layer. However, when combining with the memory layer of the invention having a higher resistance value than the $Ge_2Sb_2Te_5$ memory layer, an effect of further increasing the resistance and lowering the current was obtained. The resetting (amorphizing) current was 80 μA.

It is assumed that line A-A' indicates a line on the data line DLm shown in the FIG. 10. Node names are shown in the parentheses on the right side of the layer names. For example, arrangement for the gate electrodes of the transistors Qam, QBm, QCm, and QDm can be easily understood by the node names of the gate electrodes shown as 104 in FIG. 10.

By using the longitudinal transistor, a so-called cross point cells can be formed at each of intersections between the word lines and the data lines. That is, in a case where the word lines and the data lines are fabricated with a minimum fabrication size F, the area of the memory cell is 4 times the square of F.

Accordingly, a phase-change memory with a high integration degree and a large capacity can be attained.

The longitudinal transistor used herein operates in an off state as a so-called completely depletion SOI (Silicon On Insulator) transistor in which the intrinsic polysilicon 302 in the channel region is completely depleted. As a result, control for the threshold voltage is difficult compared with the MOS transistor on the substrate. As described in relation with the read operation shown in FIG. 5, the voltage setting in which the potential of the word line in the stand-by state is lowered relative to the potential of the source line in the selected state is suitable since the threshold voltage of the longitudinal transistor is low.

The description has been provided mainly for the phase-change memory having the memory cells constituted by a memory device formed of the chalcogenide material and a transistor. However, the constitution of the memory cell is not limited to the same.

The device of this embodiment is rewritable 1,000,000 times or more and can be manufactured with a high yield.

Figure 13:
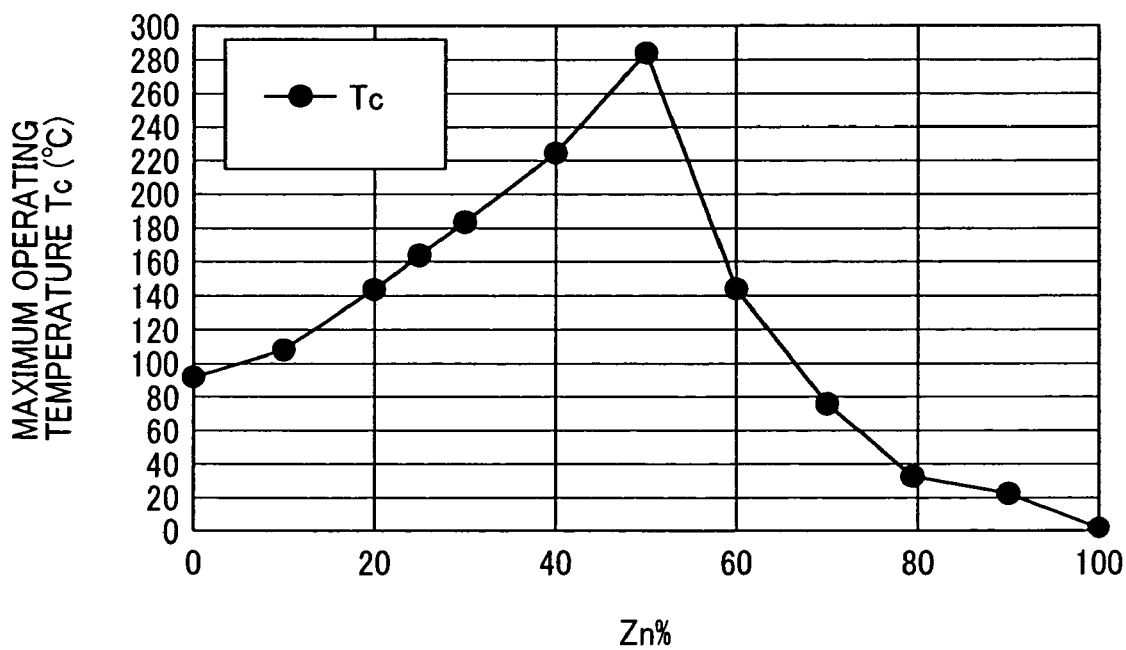
FIG. 13 is a graph showing the change of an upper limit temperature for the operation of a memory element with addition of Zn to $Ge_{25}Te_{75}$.
Figure 14:
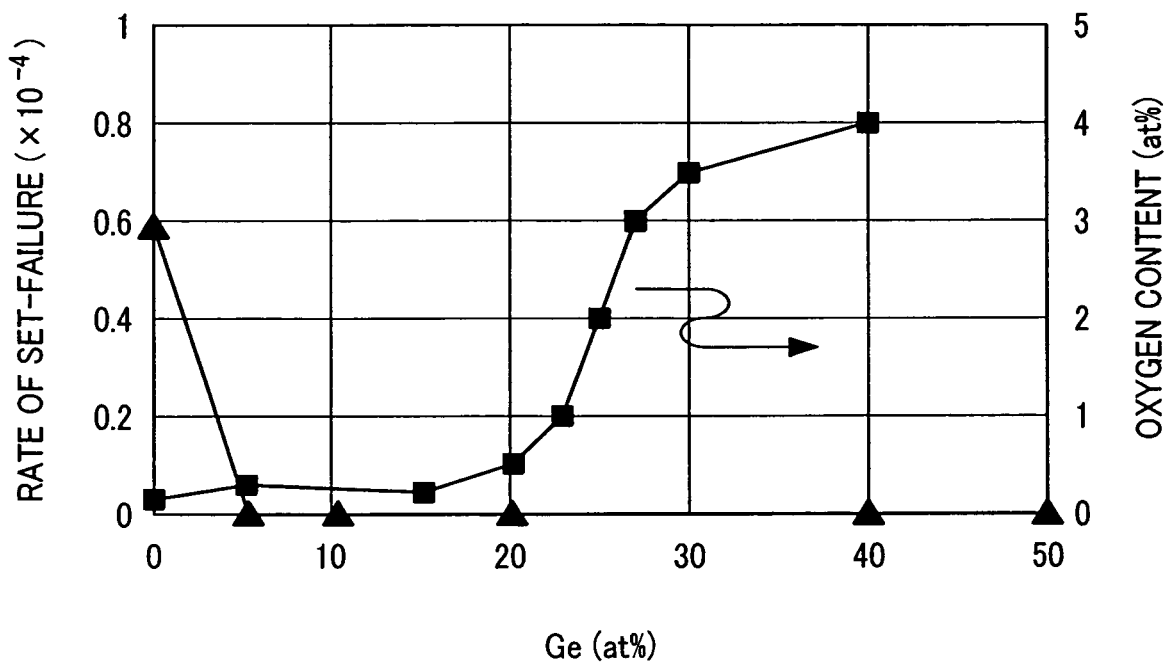
FIG. 14 is a graph showing the relationship between the addition amount of Sb to ZnTe, and the upper limit temperature for the operation of the memory element and the possible times of rewritings.

The material dependence of the chalcogenide memory layer with respect to the various characteristics of the device of this embodiment was as described below. As shown in FIG. 13, a preferred range for the content of Zn is 20 at % or more and 50 at % or less. When the content is lower than the value described above, the upper limit temperature at which the continuous operation is possible is lower than 145° C., making it difficult for practical use for which operation at a high temperature is required. When the content is higher than the value described above, the oxidation resistance is lowered to damage or peel the memory layer in the element manufacturing step and can not be passed to the final step. A problem arose with respect to the number of times of possible rewriting operations. In the experiment shown in FIG. 13, Zn was added by a method of replacing Ge and Te in $Ge_{25}Te_{75}$, each by an equal amount, with Zn. A ZnTe composition was formed by additional Zn of 50%. Subsequently, remaining Te was replaced with Zn. In the case where the Zn content was within the range described above, and the content of Ge or Sb was within a range of 2 at % or more and 25 at % or less, the operation was possible at a temperature of 145° C. or higher as shown in FIG. 14, without a problem with respect to the process. FIG. 14 shows a result when Te content was maintained at 50 at % and Zn was replaced with Ge with respect to the ZnTe. Also, in this case, oxidation resistance and heat resistance within the target range were obtained when the Ge content was 25 at % or less, that is, the Zn content was 25 at % or more. This was similarly applied to the Sb. Also, in the case of Bi, similar effect was obtained although the stability in the amorphous state was lowered unless the content was decreased to less than that of Ge or Sb. The initial characteristic of the device was satisfactory even in the case of including at least one element selected from group 2b, group 1b, groups 3a to 7a, and group 8 elements in addition to Zn. However, to obtain a high crystallization temperature, Zn is most preferred and Cd is preferred next. In the case where the Ge content exceeded 25 at %, the volume change due to the phase-change exceeded an allowable value and peeling occurred in 100,000 rewriting times or less. Also, with the view point described above, a preferred composition range was 2 at % or more and 25 at % or less. In the case of the content of 20 at % or more, the number of rewritable times was lowered. In the case of co-existence with Zn or Cd, the heat resistance was also improved. In the case of Ge, fine particles were dropped from a target during sputtering to lower the yield to 50% or less. As shown in FIG. 14, addition of Sb or Ge improved the number of rewritable times. The number of rewritable times was further improved by incorporating both of Sb and Ge. In the case where both of the elements are included, favorable rewrite operation was possible even when it exceeded 100,000 times if the sum of the contents was 40 at % or less. When the sum is 20 at % or less, a number of times of rewriting operations with high stability of resistance value could be obtained. Further, favorable initial crystallization was possible by the addition of 2 at % or more during the device manufacturing process, resulting in small crystal grains of 50 nm or less. In the case where the content of the sum of Sb and Ge is 5 at % or more and 20 at % or less, a sufficient heat resistance was obtained. The stability of the amorphous state at a low temperature was particularly high and the stability during reading was excellent. Fine crystal grains were formed upon crystallization, and the reproducibility of rewriting was particularly excellent.

With Te of 75 at % and a minimum amount of both of Zn or Cd and Ge or Sb at a minimum amount, the heat resistance is insufficient. With the Te content of 65 at % or less, sufficient heat resistance was obtained. In the case where the Te content was less than 40 at %, amorphization was difficult. In the case of the number of rewriting of 10 or less, a change did not occur.

Among the group 1b, groups 3a to 7a, and group 8 elements in addition to the group 2b elements, Co is preferred to improve the stability in the amorphous state. Other elements showing similar large effects by partially or entirely replacing Co are at least one element of Au, Ag, Cu, Ti, Zr, Hf, V, Nb, Ta, Cr, Mn, Fe, Co, Ni, Rh, Pd, La, Ce, Pr, Nd, Sm, Eu, Gd, Tb, and Dy. An addition of such elements possibly increases the activation energy for crystallization, controls the electric resistance, and provides stability upon reading and high speed crystallization upon writing (setting). Since those elements (having larger atomic number) such as Tb far below Te in the periodical table have a strong tendency of an ionic bond and have a large atomic radius, addition of them provides stability at a temperature during storage. The atomic arrangement does not tend to be fixed when the temperature increases upon setting and the high speed crystallization is possible.

In addition to those described above, Ga, In, Tl, Si, Sn, P, As, Pb, S, Se, N, O, H, B, and C may be contained by 25 at % or less. In the case where the amount contained is 10 at % or less, undesired effect in which the state tends to be changed by repetitive reading operation can be prevented. In the case of N or O, a change of crystal form at a high temperature can be prevented. With addition of Sn and Pb of 3 at % or more and 10 at % or less, the crystallization speed was improved by 30% or more. The effect of Sn was particularly significant. Si and Se had an effect of preventing oxidation in the manufacturing process. In the case of In, when In is added while partially replacing Zn (replacing Zn atoms of 30 to 70%), the crystallization speed was increased by 1.5 times to 3 times although the effect of improving the heat resistance is decreased a little.

Figure 15:
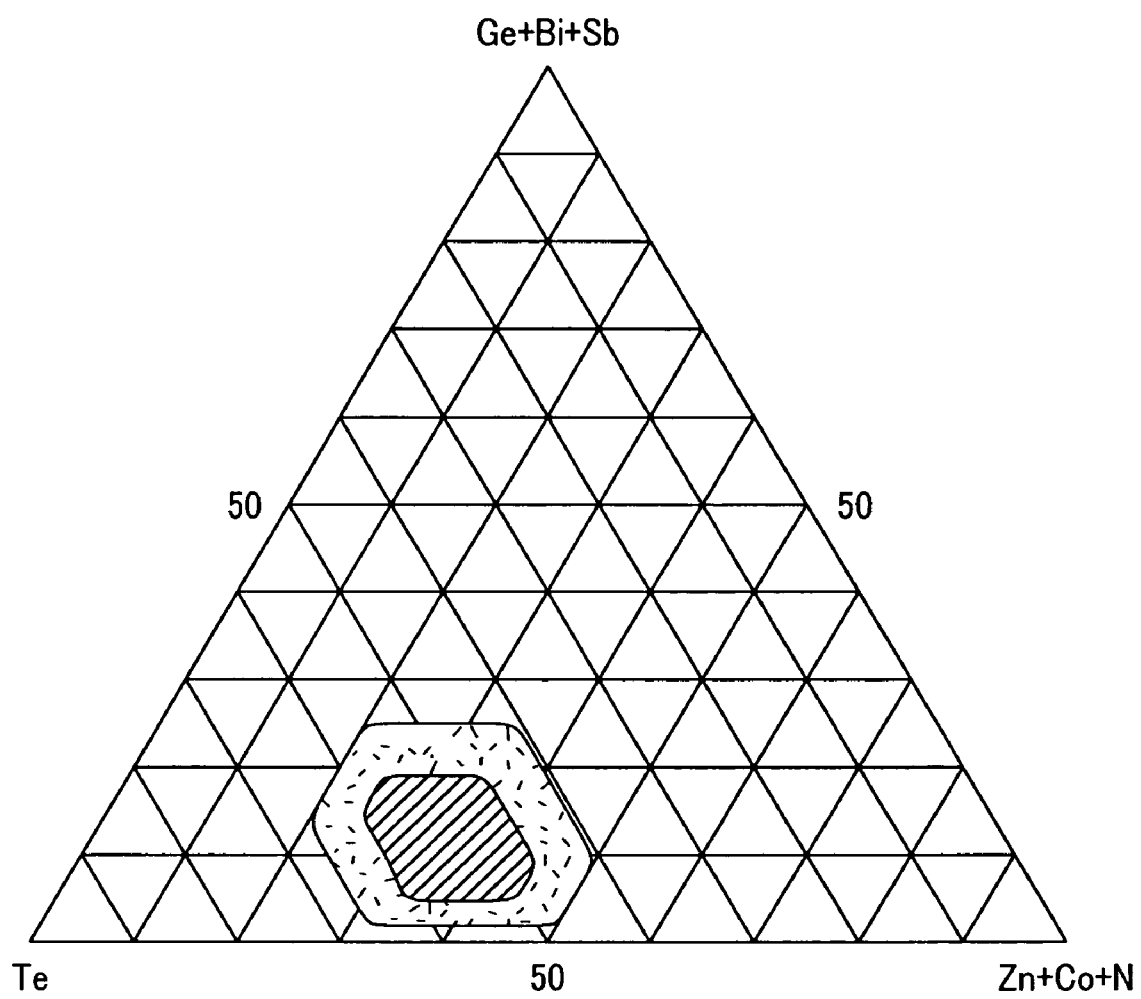
FIG. 15 is a diagram showing the preferred and particularly preferred compositional ranges of GeBiSb—Te—ZnCoN series materials.
Figure 16:
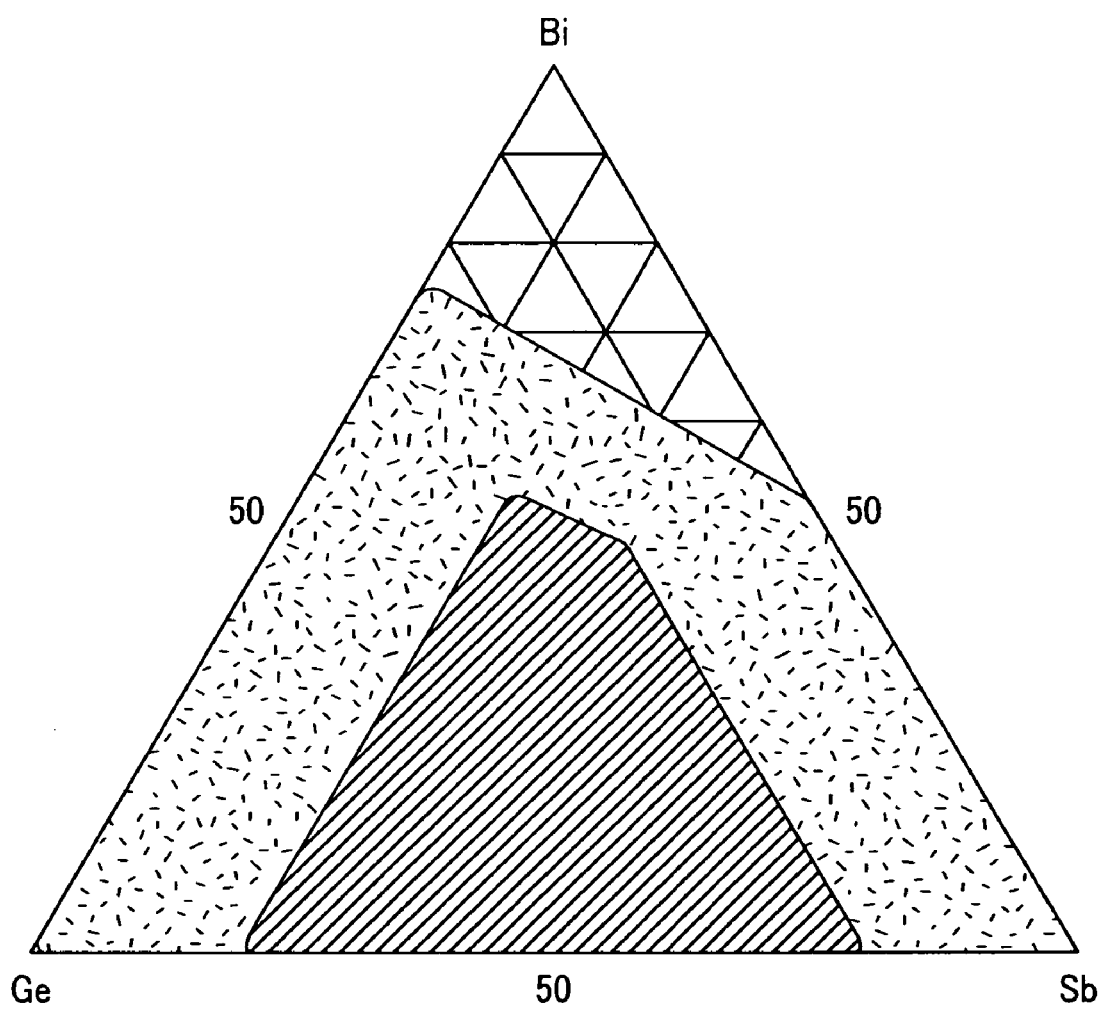
FIG. 16 is a diagram showing a preferred composition range and particularly preferred composition range of GeBiSb series materials.
Figure 17:
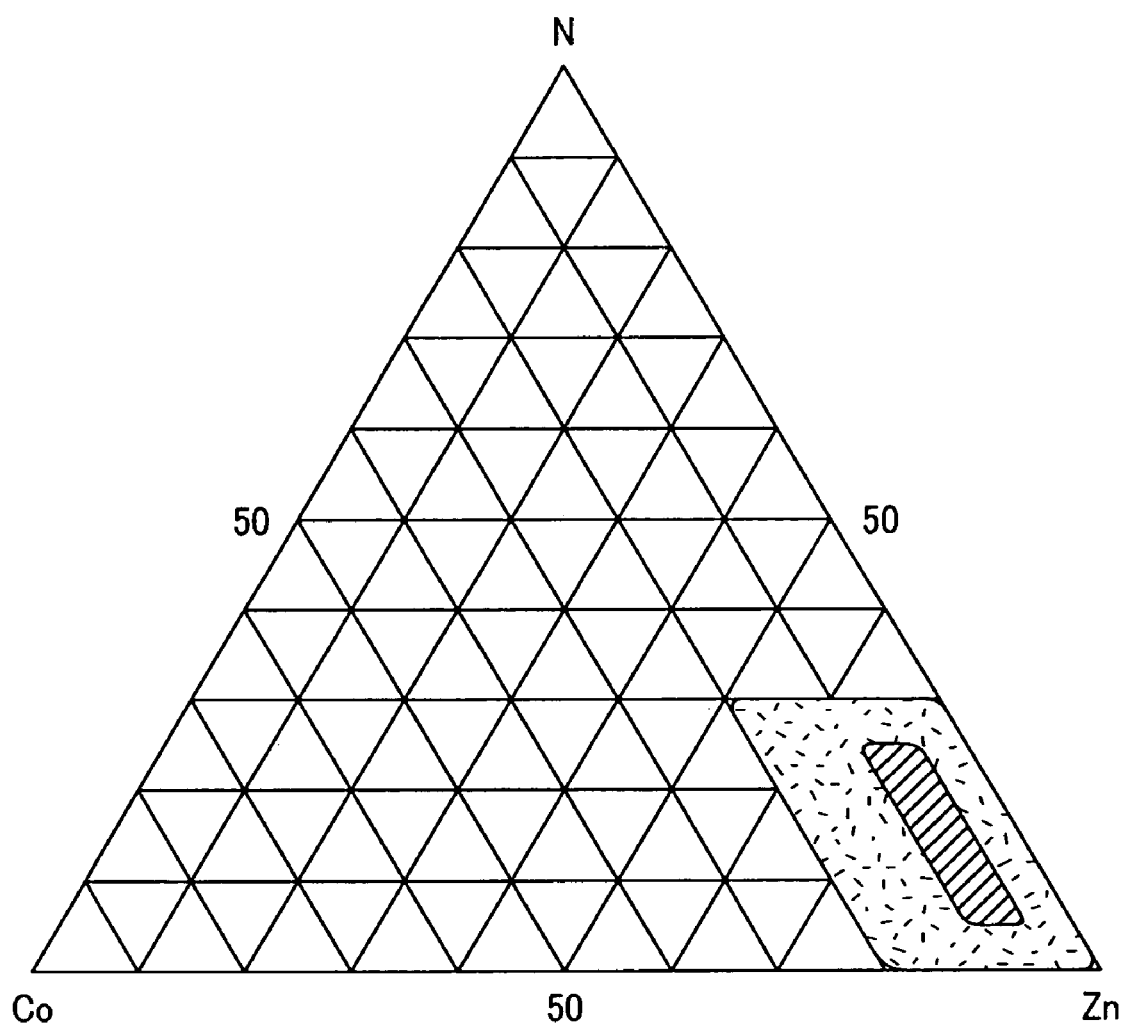
FIG. 17 is a diagram showing a preferred compositional range, and a particularly preferred composition range of a ZnCoN series material.

FIGS. 15 to FIG. 17 show a preferred composition range for performance (including life) at a practical level, and a particularly preferred composition range capable of obtaining an element with high performance and long life, and the composition of elements including Zn and Te within the composition range. As shown in FIG. 15, an apex described with the name of an element represents a composition including 100 at % of the element, and a side opposing to the apex represents a composition with an element of 0 at % described at the apex. Nine lines parallel with the side are present toward the apex and represent at % at a pitch of the content of 10% respectively. The composition at an arbitrary point in a triangular shape represents a material composition of three or more element systems having the content of the elements described at three apexes although it may possibly be observed with some displacement with respect to the problem of drawing or printing.

In the case where three elements are described at the apex, this shows that the sum of at % of three types of elements may be within the range shown in the drawing. A preferred composition range shown in the drawing is a composition including 2 at % or more and less than 25 at % of at least one element selected from the group consisting of Ge and Sb and Bi, 40 at % or more and 65 at % or less of Te, and 20 at % or more and 50 at % or less of at least one element selected from the group 2b, group 1b, groups 3a to 7b, and group 8 elements. A preferred ratio and a particularly preferred ratio of three kinds of elements described at the apexes of FIG. 15 are shown in FIG. 16 and FIG. 17. In the drawings, the unit on the three axes of the triangular shape is not at % but %. Among a plurality of elements described at the apexes shown in FIG. 15, Zn may be replaced partially or entirely with Cd. Co may be replaced partially or entirely with at least one element selected from the group 1b, groups 3a to 7a, and the group 8 elements. The most preferred composition range shown in FIG. 15 is a composition range including 5 at % or more and 20 at % or less of at least one element selected from the group including Ga, Sb and Bi, 45 at % or more and 60 at % or less of Te, and 25 at % or more and 45 at % or less of at least one elements selected from the group 2b, group 1b, groups 3a to 7a, group 8 elements, and nitrogen. Further, it can be seen in FIG. 17 that N (nitrogen) is preferably 15% or less. Since the content of the elements for the group consisting of Zn, N, and Co is 50 at % at the maximum in FIG. 15, the content of nitrogen is preferably: 50 at %×0.15=7.5 at % or less. That is, a preferred composition range can be provided by a system comprising a minimum ternary element system, a maximum octonary element system, or an element system including a lot of elements by including preferred elements even if replacing Zn or Co, by multiplying the preferred range of composition ratio in FIG. 15 by the element ratio in the preferred range in FIG. 16 and FIG. 17. A preferred composition range shown in FIG. 16 is a range where the ratio of Bi is less than the ratio indicated by the line connecting the line of Bi75% and Ge25% with the line of Bi50% and Sb50%. Particularly, the preferred range is a range where the Bi ratio is less than the ratio indicated by the line connecting the line of Bi60% and Ge40% with the line of Gi30% and Sb70%, and the ratio of Sb is 20% or more and 80% or less, and the ratio of Ge is 20% or more and 80% or less. More particularly, the ratio of Bi is 20% or more in the range described above. By incorporating Bi, an effect of improving the crystallization speed can be obtained. A preferred composition range shown in FIG. 17 is a range where the ratio of Zn is 50% or more and up to 100%, the ratio of Co is 20% or less and the ratio of N is 30% or less. A particularly preferred range is a range where the ratio of Zn is 65% or more, the ratio of Co is 10% or less and 5% or more, and the ratio of N is 25% or less and 5% or more.

The stability in the amorphous state is insufficient in the case where Te is excessive or insufficient with respect to the range. In the case where Ge is excessive, oxidation resistance is insufficient. In the case where Sb is excessive, stability in the amorphous state is insufficient. In the case where Sb is insufficient, an error regarding setting operation for crystallization may occur, or setting may be difficult. In the case where the sum of the content of Ge and Sb (also including the case where the content of one of them is 0%) is insufficient, the melting point is excessively high to increase the setting current. While Co is shown as a typical element, since the electric resistance is excessively low in the case where the transition element such as Co other than Zn and Cd is excessive, the content of the element is preferably 8 at % or less, more preferably, 3 at % or less. Since the stability of the amorphous state is lowered in the case where content of the element is insufficient, the content is preferably 1 at % or more. In the case where N (nitrogen) is excessive, since the change of the characteristic due to rewriting exceeds an allowable range, the content is preferably 6 at % or less, more preferably, 3 at % or less. Since the crystal grains excessively grow in the case where the content is excessively small, causing to increase errors in resetting, the content is preferably 1 at % or more.

For the heat generating material above a lower contact (plug), in the case of using, instead of TiAlN, a similar material with a melting point of 1000° C. or higher and with Zn or Cd of 10 at % or more which is more than that of the memory layer material, auxiliary heating can be provided to the lower portion of the memory layer with the Joule heat generation in the portion. This could reduce the resetting current by about 30% compared with the case of the W contact and obtain a satisfactory characteristic for the multiple times of rewriting compared with the case of the W contact.

A barrier film made of, for example, nitride of a transition metal such as TiAlN and oxide such as CrO, a film made of a similar material with a melting point of 1000° C. or higher and with Zn or Cd of more than 10 at % than the memory layer, a metal conduction film such as a $W_{80}Ti_{20}$, or a laminate film thereof is formed adjacent with the chalcogenide memory layer, an advantage of increasing the number of times of possible rewriting can be provided. Alternatively, for the purpose of suppressing dissipation of heat necessary for changing the phase state of the chalcogenide, films with poor heat conductivity such as ITO (mixture of oxide of indium and tin) can be interposed.

According to the embodiment described above, since the resistance value is high due to the addition of a large amount of Zn to Ge, Sb, and Te, combination with a high resistance transistor or the like is possible and the resetting current can be decreased. Since the optical transmittance is high, a multi-layered memory can be also formed by light irradiation and voltage application. Also, in the process, unevenness on the surface of a sputtering target can be suppressed to improve the production yield. Also, by using a similar material to the plug below the memory layer, an effect of improving the number of rewritable times or decreasing in the resetting current can be obtained.

Figure 12:
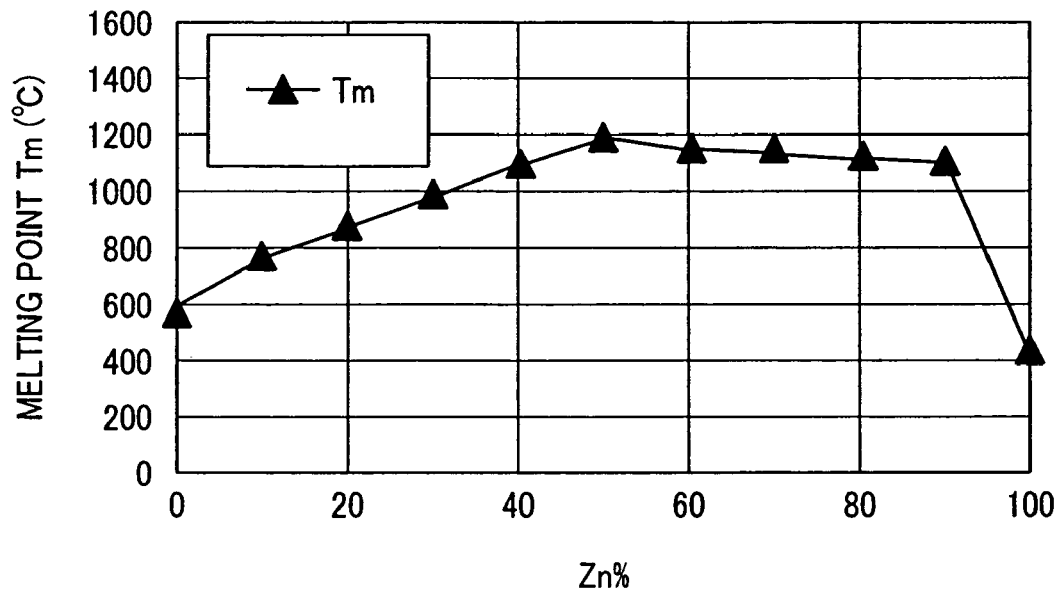
FIG. 12 is a graph showing the change in the melting point of a solid phase portion with addition of Zn to $Ge_{25}Te_{75}$.
Figure 18:
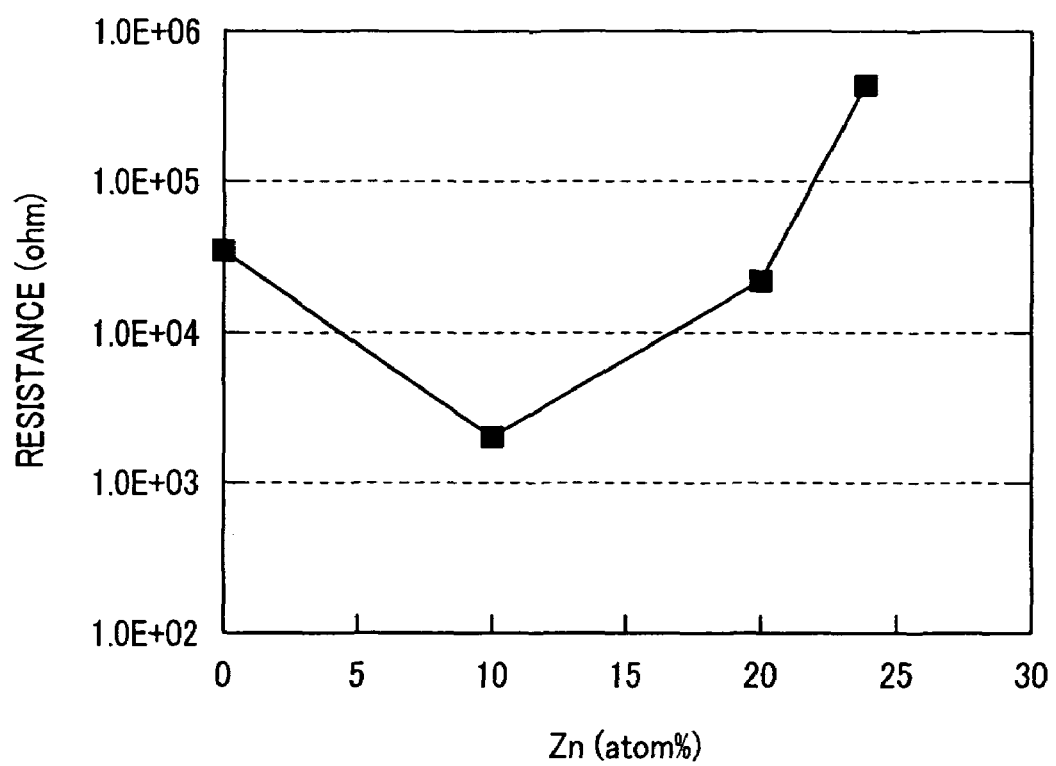
FIG. 18 is a graph showing the relationship between Zn content and resistance in a case of a Zn—Ge—Sb—Te film.

As shown in FIG. 18, it is obvious that the resistance value does not monotonously increase together with the amount of Zn added. When the content of Zn added is 10 at %, the resistance value is lowered compared with the case where Zn is not added. On the other hand, since the resistance value increases if the addition amount of Zn is 20 at % or more, the resetting current can be decreased. Since the resistance value of 10 kΩ or higher is used as a guide for the low resetting current, the addition amount of Zn is preferably 20 at % or more. Even if the addition amount of Zn is 5 at % or less, the resistance value increases to 10 kΩ or more. In this case, however, as shown in FIG. 12, the melting point rises scarcely and does not reach 900° C. which is used as a guide for increasing the melting point. Further, as described above, in the case where the addition amount of Zn exceeds 50 at %, it is not preferred since the oxidation resistance is deteriorated. Thus, the addition amount of Zn is preferably 20 at % or more and 50 at % or less.

Embodiment 2

In this embodiment, addresses for the memory device are designated not only electrically but also using light. With respect to devices, four layers are formed in the direction perpendicular to the surface of the substrate to increase the number of devices per area. In this case, since a memory layer including group 2 elements such as Zn and Cd has a wide optical band gap, it is advantageous. For example, a $Zn_{25}Ge_{25}Te_{50}$ memory layer was used.

Figure 11:
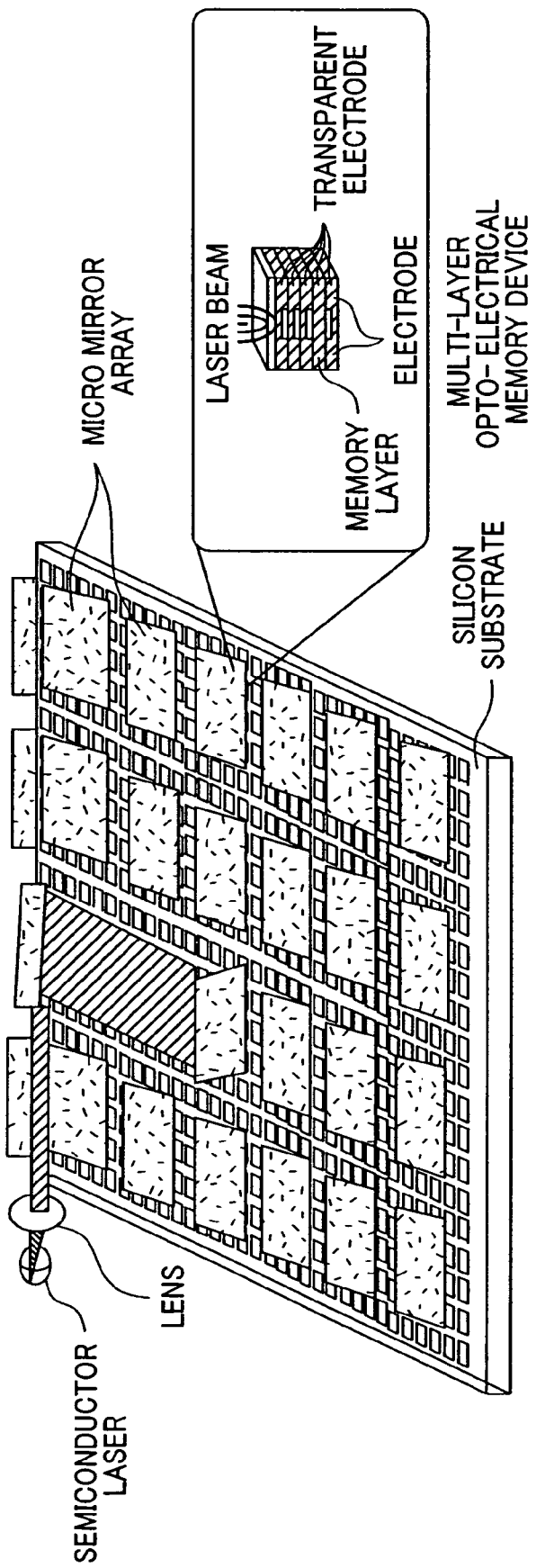
FIG. 11 is a view showing a structure of a multi-layered memory element array used in combination with a mirror array.

As shown in FIG. 11, a light 93 with a 660 nm wavelength of a semiconductor laser 91 is guided by a guide mirror to each 500×500 reflection mirror array 97 having an area of 16 μm square, which is formed from single silicon crystal and is one of MEMS techniques. Each of the mirrors in the reflection mirror array corresponds to a group of four-layered 20×20 memory devices of in the plane, and can be rotated ±15° around an axis. A cylindrical lens is formed to each of the mirrors on the side of the memory device group, which forms an elongate light spot with a width of 0.5 μm and a length of 16 μm. The light is adapted to hit on one row of 32 rows of the device groups corresponding to the mirrors in the vertical direction of the drawing by the change of the angle of the mirrors. Each of the devices has 4 layers as shown in the fragmentary enlarged view. Each layer has a constitution of sandwiching a chalcogenide memory layer between transparent ITO electrodes. An $SiO_2$ heat insulative layer with a thickness of 50 nm is formed between the layers. The transparent electrode in each layer on one side of the device is divided into 16 rectangular shape elongate in the vertical direction per one mirror. The address designation in the left-to-right direction is conducted by the selection of the electrode. Selection for the layer in the vertical direction is conducted by the application of a voltage while selecting a transparent electrode pair. With the constitution described above, the device structure is simplified even if the 4-layered constitution is used, resulting in reduction in the cost. In the case where the mirror array and the memory array can be accurately positioned, this provides a merit of detaching the memory array from the device and replacing the same. Each mirror is driven by an electrostatic force or an electromagnetic force by the transistor array therebelow.

With the irradiation of the laser light, photo-carriers are generated in the memory device. The photo-carriers are accelerated under the electric field to cause carrier multiplication so that recording and reading based on the resistance values can be performed only by the devices applied with both light and voltage. Reading was conducted at a light intensity of approximately one fifth of the recording.

In this embodiment, it is essential that the optical transmittance of each layer in the memory device is 30% or more. The optical transmittance was actually designed as 50% or more.

Also, in this embodiment, a preferred range of the memory layer composition is similar to that in Embodiment 1. In this embodiment, it is important that the transmittance of the memory layer is high and the composition of $Zn_{50}Te_{50}$ is preferred in this regard. There are requirements for the process or phase-change described in Embodiment 1. A preferred composition range and more preferred composition range are similar to those in Embodiment 1.

In a case of using, for example, an array laser as a laser light source, laser lights can be sent simultaneously to a plurality of mirrors to increase the data transfer rate nearly by four times.

The number of the reflection mirror array can be increased to about 1500×1500 for use where large capacity is necessary.

Large memory capacity can be obtained with a simple device constitution according to the embodiment described above.

The present invention is applicable to a recording device or semiconductor non-volatile memory, both of which use a phase-change material.

The invention claimed is:

1. A memory device including a memory element comprising:
   a memory layer containing 2 at % or more and less than 25 at % of at least one element selected from the group consisting of Ge, Sb, and Bi, 40 at % or more and 65 at % or less of Te, and 20 at % or more and 50 at % or less of Zn or Cd, and storing information by causing reversible phase-change between a crystal phase and an amorphous phase;
   an electrode formed on both surfaces of the memory layer; and
   a region adjacent to the memory layer, in which the content of Zn or Cd is higher by 10 at % or more than that of the memory layer.

2. A memory device according to claim 1, wherein the memory device transmits 30% or more of recording light or reading light.

3. A memory device comprising:
   a plurality of memory cells;
   a plurality of word lines for selecting the plurality of memory cells; and
   a plurality of data lines arranged orthogonally to the plurality of word lines and reading signals from the plurality of memory cells,
   wherein each of the plurality of memory cells includes
      a memory layer containing Ge or Sb, 40 at % or more of Te, 20 at % or more and 50 at % or less of Zn or Cd, and recording information by causing reversible phase-change between a crystal phase and an amorphous phase;
      electrodes formed so as to sandwich the memory layer therebetween for applying a voltage to the memory layer; and
      a region adjacent to the memory layer, in which the content of Zn or Cd is higher by 10 at % or more than that of the memory layer.

4. A memory device according to claim 3, wherein an insulating film is disposed between the memory layer and one surface of the electrode.

5. A memory device comprising:
   a plurality of memory cells;
   a plurality of word lines for selecting the plurality of memory cells; and
   a plurality of data lines arranged orthogonally to the plurality of word lines and reading signals from the plurality of memory cells,
   wherein each of the plurality of memory cells includes
      a memory layer containing Ge, Sb, 40 at % or more of Te, and 20 at % or more and 50 at % or less of at least one element selected from Zn, Au, Ag, Cu, Ti, Zr, Hf, V, Nb, Ta, Cr, Mn, Fe, Co, Ni, Rh, Pd, La, Ce, Pr, Nd, Sm, Eu, Gd, Tb, Dy, and Cd, and recording information by causing reversible phase-change between a crystal phase and an amorphous phase; and electrodes formed so as to sandwich therebetween the memory layer for applying the voltage to the memory layer,
wherein an insulating layer is disposed between the memory layer and one surface of one said electrode.

6. A memory device according to claim 5,
wherein the insulating layer is disposed in contact with a negative one of said electrodes.

* * * * *